(12) United States Patent
Vaidyanathan et al.

(10) Patent No.: US 10,777,250 B2
(45) Date of Patent: Sep. 15, 2020

(54) SAVE-RESTORE CIRCUITRY WITH METAL-FERROELECTRIC-METAL DEVICES

(71) Applicant: Intel Corporation, Santa Clara, CA (US)

(72) Inventors: Kaushik Vaidyanathan, Santa Clara, CA (US); Daniel H. Morris, San Francisco, CA (US); Huichu Liu, Santa Clara, CA (US); Dileep J. Kurian, Bangalore (IN); Uygar E. Avci, Portland, OR (US); Tanay Karnik, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/144,896

(22) Filed: Sep. 27, 2018

(65) Prior Publication Data

US 2019/0043549 A1 Feb. 7, 2019

(51) Int. Cl.
*G11C 11/22* (2006.01)
*G06F 1/3234* (2019.01)
(Continued)

(52) U.S. Cl.
CPC ........ *G11C 11/2259* (2013.01); *G06F 1/3275* (2013.01); *G11C 11/2255* (2013.01);
(Continued)

(58) Field of Classification Search
CPC .................................................. G11C 14/009
(Continued)

(56) References Cited

U.S. PATENT DOCUMENTS

2004/0125644 A1* 7/2004 Komatsuzaki .......... G11C 11/14
365/154
2006/0067138 A1* 3/2006 Ogiwara ................. G11C 11/22
365/189.09
(Continued)

FOREIGN PATENT DOCUMENTS

JP 2000077982 A1 3/2000
WO 2008129362 A2 10/2008
(Continued)

OTHER PUBLICATIONS

Masood Qazi et al., "A 3.4 pJ FeRAM-Enabled D Flip-Flop in 0.13 μm CMOS for Nonvolatile Processing in Digital Systems," IEEE Journal of Solid-State Circuits 49, No. 1 (n. d.), pp. 202-211.
(Continued)

*Primary Examiner* — Min Huang
(74) *Attorney, Agent, or Firm* — Schwabe, Williamson & Wyatt, P.C.

(57) ABSTRACT

Embodiments include apparatuses, methods, and systems associated with save-restore circuitry including metal-ferroelectric-metal (MFM) devices. The save-restore circuitry may be coupled to a bit node and/or bit bar node of a pair of cross-coupled inverters to save the state of the bit node and/or bit bar node when an associated circuit block transitions to a sleep state, and restore the state of the bit node and/or bit bar node when the associated circuit block transitions from the sleep state to an active state. The save-restore circuitry may be used in a flip-flop circuit, a register file circuit, and/or another suitable type of circuit. The save-restore circuitry may include a transmission gate coupled between the bit node (or bit bar node) and an internal node, and an MFM device coupled between the internal node and a plate line. Other embodiments may be described and claimed.

20 Claims, 15 Drawing Sheets

(51) Int. Cl.
*G11C 11/413* (2006.01)
*G11C 14/00* (2006.01)

(52) U.S. Cl.
CPC ........ *G11C 11/2257* (2013.01); *G11C 11/413* (2013.01); *G11C 14/0072* (2013.01); *G11C 11/221* (2013.01)

(58) Field of Classification Search
USPC .......................................................... 365/154
See application file for complete search history.

(56) References Cited

U.S. PATENT DOCUMENTS

| | | | | |
|---|---|---|---|---|
| 2006/0077715 | A1* | 4/2006 | Pratlong | G11C 7/12 365/185.23 |
| 2012/0013319 | A1* | 1/2012 | Patil | G11C 5/148 323/282 |
| 2014/0328115 | A1* | 11/2014 | Bartling | H03K 3/35625 365/156 |
| 2016/0035397 | A1* | 2/2016 | Pilo | G11C 11/417 365/154 |
| 2016/0172024 | A1 | 6/2016 | Ma | |
| 2016/0232968 | A1 | 8/2016 | August et al. | |
| 2016/0261252 | A1 | 9/2016 | Agarwal et al. | |

FOREIGN PATENT DOCUMENTS

| | | |
|---|---|---|
| WO | 2018111215 A1 | 6/2018 |
| WO | 2018125024 A1 | 7/2018 |
| WO | 2018174865 A1 | 9/2018 |

OTHER PUBLICATIONS

Shoichi Masui et al., "Design and Applications of Ferroelectric Nonvolatile S U M and Flip-Flop with Unlimited Read|Program Cycles and Stable Recall," IEEE Custom Integrated Circuits Conference, (2003), 4 pages.

Avci et al., "Ferroelectric Memory Devices With Integrated Capacitors and Methods of Manufacturing the Same", International Application No. PCT/US2017/068562, filed Dec. 27, 2017, 62 pages.

International Search Report and Written Opinion dated Dec. 5, 2019 for International Application No. PCT/US2019/047768, 11 pages.

Bongno Yoon et al., "Metal-ferroelectric-metal capacitor based persistent memory for electronic product code class-1 generation-2 uhf passive radio-frequency identification tag", In: Journal of Applied Physics, vol. 105, Issue 6, Mar. 16, 2009, 6 pages.

* cited by examiner

SAVE-RESTORE CIRCUITRY WITH METAL-FERROELECTRIC-METAL DEVICES

FIELD

Embodiments of the present invention relate generally to the technical field of electronic circuits, and more particularly to save-restore circuitry with metal-ferroelectric-metal devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Many electronic circuits, such as processors, use power gating to turn off circuit blocks that are not in use, thereby saving power. Typically, some data must be retained in order to turn a circuit block off. That data may be stored in flip-flops and/or register file circuits, among other options. Some key challenges to power gating are to reduce latency to wake up from sleep mode, and to reduce standby power consumption in sleep mode.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
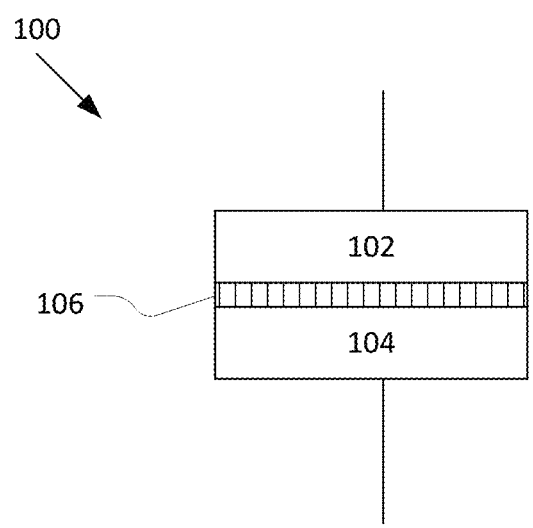
FIG. 1 illustrates a cross-sectional view of a metal-ferroelectric-metal (MFM) device that may be used in save-restore circuitry, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Described herein are apparatuses, methods, and systems associated with save-restore circuitry including metal-ferroelectric-metal (MFM) devices. The save-restore circuitry may be coupled to a bit node and/or bit bar node of a pair of cross-coupled inverters to save the state of the bit node and/or bit bar node when an associated circuit block transitions to a sleep state, and restore the state of the bit node and/or bit bar node when the associated circuit block transitions from the sleep state to an active state. The save-restore circuitry may be used in a flip-flop circuit, a register file circuit, and/or another suitable type of circuit. The save-restore circuitry may include a transmission gate coupled between the bit node (or bit bar node) and an internal node, and an MFM device coupled between the internal node and a plate line. In some embodiments, the save-restore circuitry may include a capacitive load coupled between the internal node and ground to provide charge-sharing with the MFM device as part of the restore operation. In some embodiments, the capacitive load may be another MFM device.

Additionally, or alternatively, the save-restore circuitry may include a selector device (e.g., transistor) coupled between the internal node and ground to initialize the internal node to ground (e.g., 0 volts) and/or initialize the MFM device to logic 0 prior to the save operation. The selector device may additionally or alternatively initialize the internal node to ground prior to the restore operation.

The save-restore circuitry described herein may provide several advantages over prior power gating techniques, including in-place save-restore, reduced latency for switching between sleep state and active state, reduced energy cost for switching between sleep state and active state, and/or reduced standby power for holding the data during the sleep state.

FIG. 1 illustrates a cross-sectional view of a metal-ferroelectric-metal (MFM) device 100 that may be used in save-restore circuitry (e.g., for a flip-flop and/or register file circuit), in accordance with various embodiments. MFM device 100 may include a first electrode 102 and a second electrode 104, with a ferroelectric material 106 between the first electrode 102 and second electrode 104. The ferroelectric material 106 may be any suitable material, such as HfZrO2 (HZO).

Unlike a normal dielectric-based capacitor, when implemented in a memory cell (e.g., as discussed further below), an MFM device uses polarization charge to store the memory states. For example, a positive or negative polarization charge may indicate a logic 1 or logic 0, respectively. To switch the state of the MFM device, the voltage applied across the MFM device (e.g., between the first electrode 102 and second electrode 104) must be greater than a threshold (e.g., corresponding to the ferroelectric coercive voltage). For example, the applied voltage may be greater than a positive threshold to switch the state of the MFM device from logic 0 to logic 1, and less than a negative threshold to switch the state of the MFM device from logic 1 to logic 0.

The MFM device 100 may use different materials (e.g., HZO) and process integration than "thick" ferroelectric capacitors that are used in prior circuits. The MFM device 100 may achieve larger polarization density at scaled thicknesses (e.g., less than 10 nanometers) than was possible with thick ferroelectric capacitors. Additionally, MFM devices 100 are able to be integrated with logic devices, since they use a scalable structure and a relatively thin layer of ferroelectric material 106.

Figure 2:
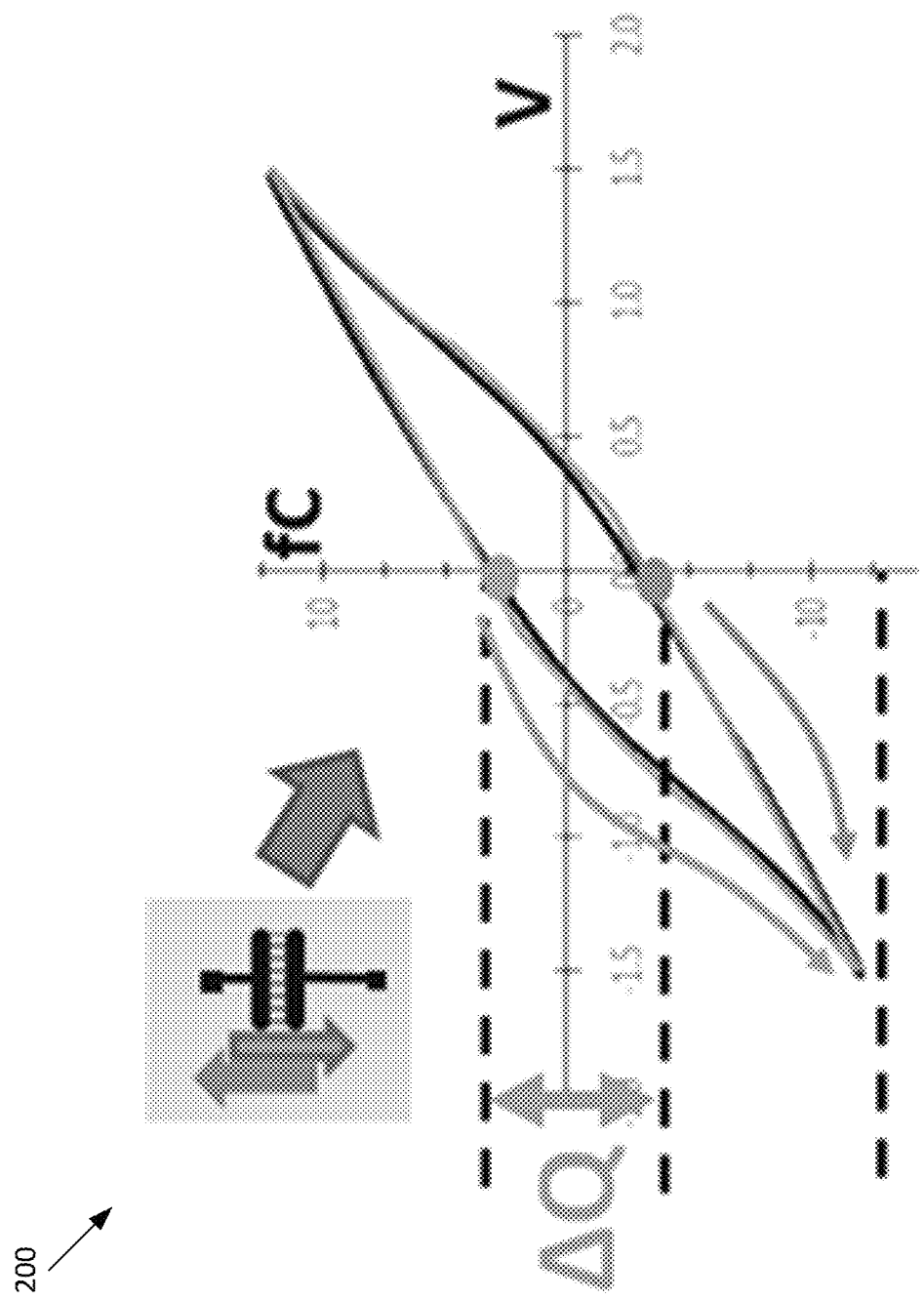
FIG. 2 illustrates a charge vs. voltage hysteresis loop for an MFM device, in accordance with various embodiments.

FIG. 2 illustrates a charge vs. voltage hysteresis loop 200 for an MFM device (e.g., MFM device 100), in accordance with various embodiments. In contrast to a normal capacitor, the MFM device stores a polarization charge even when there is no voltage across the MFM device. The voltages shown in FIG. 2 are merely examples, and scaled MFM devices may be switched with lower voltages than shown in FIG. 2.

To illustrate operation of an MFM device (e.g., MFM device 100), FIGS. 3A-3D illustrate example voltages that may be used to perform various operations on a memory cell 300 that includes an MFM device 302, in accordance with various embodiments. The voltage values shown in FIGS. 3A-3D are merely examples that are provided to illustrate the relationship between voltages at different nodes to perform the various operations. Some embodiments may use other voltage values, e.g., with the same relative relationship.

The memory cell 300 may further include a selector device (e.g., transistor) 304. The source terminal of the transistor may be coupled to a bit line BL to receive a bit line signal, the gate terminal of the transistor 304 may be coupled to a word line WL to receive a word line signal, and the drain terminal of the transistor 304 may be coupled to an internal node 306 of the memory cell 300. The MFM device 302 may have one terminal coupled to the internal node 306 and the other terminal coupled to a plate line PL to receive a plate line signal.

Figures 3A, 3B, 3C, 3D:
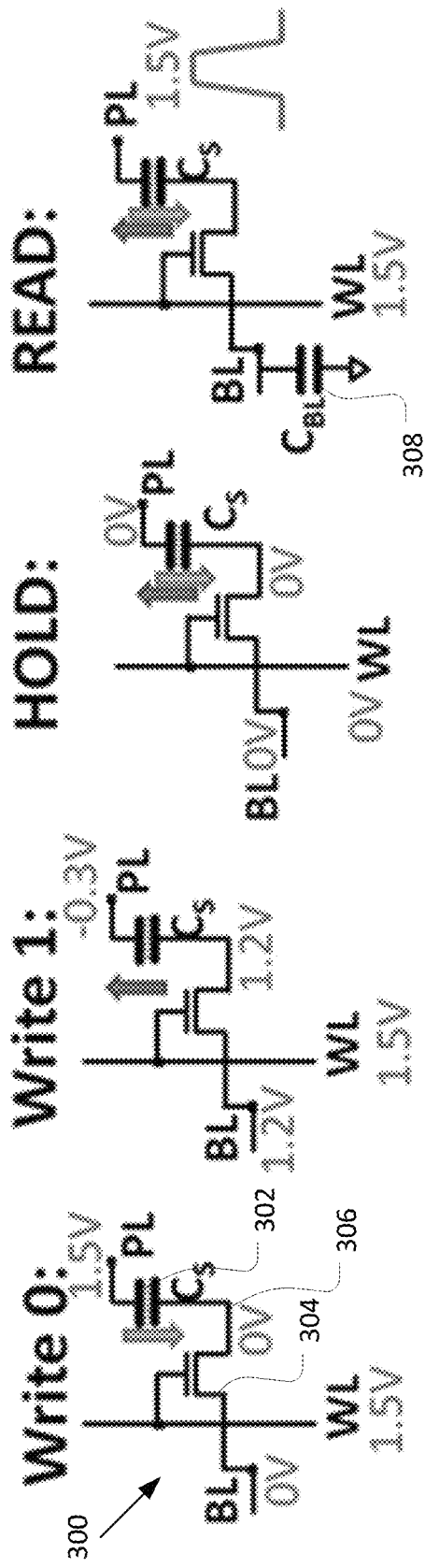
FIG. 3A illustrates example voltages for a memory cell that includes an MFM device to perform a write operation to write a logic 0 to the memory cell, in accordance with various embodiments.
FIG. 3B illustrates example voltages for a memory cell that includes an MFM device to perform a write operation to write a logic 1 to the memory cell, in accordance with various embodiments.
FIG. 3C illustrates example voltages for a memory cell that includes an MFM device to perform a hold operation to hold a logic value stored by the memory cell, in accordance with various embodiments.
FIG. 3D illustrates example voltages for a memory cell that includes an MFM device to perform a read operation to read a logic value stored by the memory cell, in accordance with various embodiments.

FIG. 3A illustrates example voltages of the bit line signal, word line signal, and plate line signal during a write operation to write a logic 0 to the memory cell 300. For example, as shown, the word line signal may be 1.5 V to turn on the transistor 304, and the bit line signal may be 0 V to pass the 0 V to the internal node 306. The plate line signal may be a write 0 voltage, such as 1.5 V. The differential between the voltage at the internal node 306 and the voltage at the plate line PL may cause the MFM device 302 to store a first polarization charge that corresponds to logic 0.

FIG. 3B illustrates example voltages of the bit line signal, word line signal, and plate line signal during a write operation to write a logic 1 to the memory cell 300. For example, as shown, the word line signal may be 1.5 V to turn on the transistor 304, and the bit line signal may be 1.5 V to pass the 1.5 V to the internal node 306. The plate line signal may be a write 1 voltage, such as −0.3 V. The differential between the voltage at the internal node 306 and the voltage at the plate line PL may cause the MFM device 302 to store a second polarization charge that corresponds to logic 1.

FIG. 3C illustrates example voltages at various nodes of the memory cell 300 during a hold operation to hold the stored value of the memory cell 300. As shown, the word line, bit line, plate line, and internal node may all be at 0 V. This is in contrast to memory cells with traditional capacitors, in which a hold voltage must be applied to the memory cells to hold the stored value.

FIG. 3D illustrates example voltages of the word line signal and plate line signal during a read operation to read the logic value stored by the memory cell 300. As shown, a capacitive load 308 may be coupled to the bit line BL (e.g., between the bit line BL and ground) to provide charge-sharing for the MFM device 302. The word line signal may be at 1.5 V to turn on the transistor 304. The plate line signal may be at a read voltage, such as 1.5 V. The MFM device 302 may be conductively coupled to the bit line BL by the transistor 304, and may engage in charge-sharing with the capacitive load 306 to provide a voltage at the bit line BL that is based on the polarization charge stored by the MFM device (and thus based on the logic value stored by the MFM device). Accordingly, the logic value of the bit stored by the memory cell 300 may be determined based on the voltage at the bit line BL during the read operation.

Figure 4:
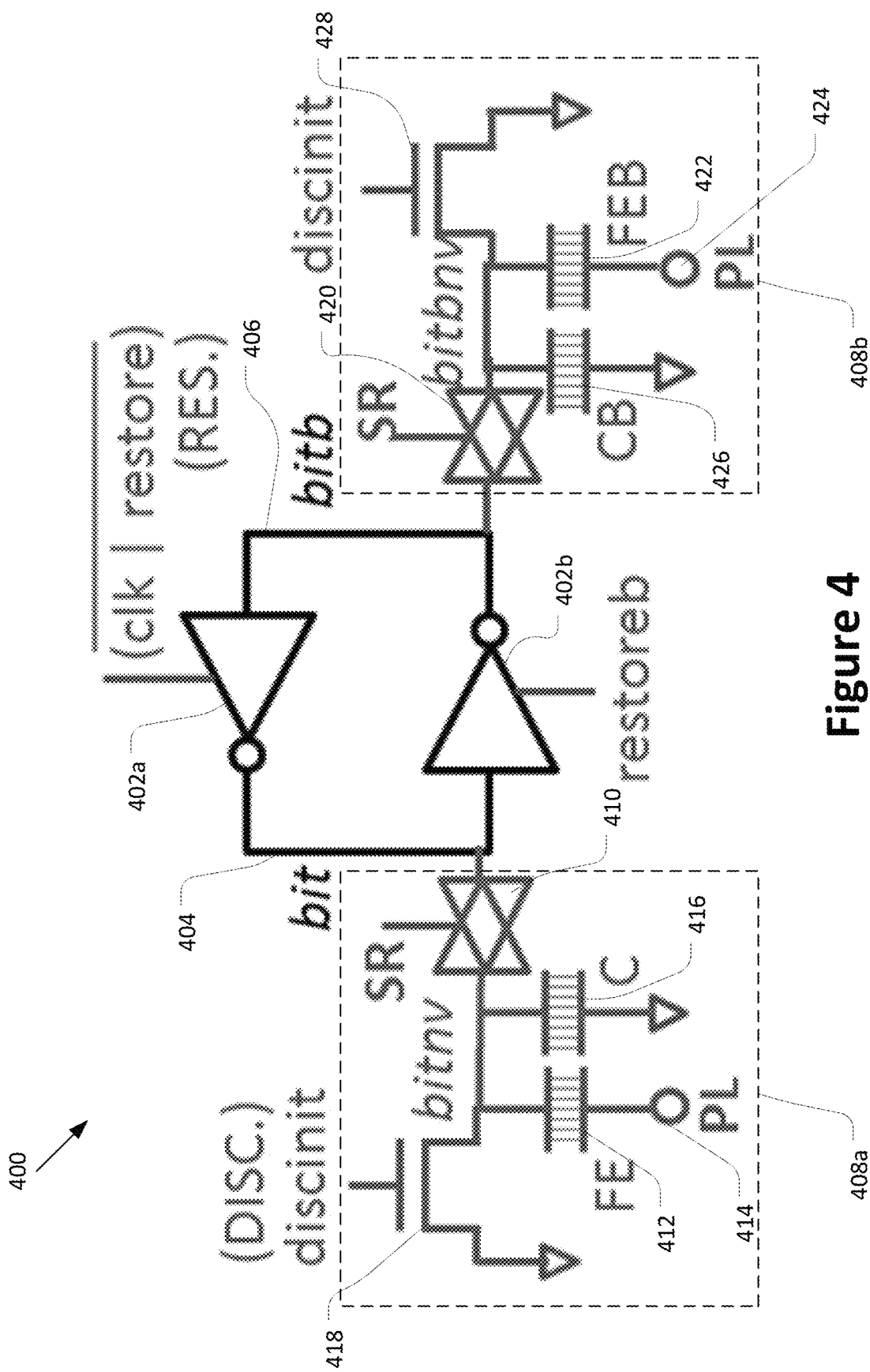
FIG. 4 illustrates a cross-couple circuit including save-restore circuitry, in accordance with various embodiments.

FIG. 4 illustrates a cross-couple circuit 400 in accordance with various embodiments. The cross-couple circuit 400 may be included in a flip-flop in some embodiments. For example, the cross-couple circuit 400 may be a slave cross-couple stage of a master-slave flip-flop.

Figure 5:
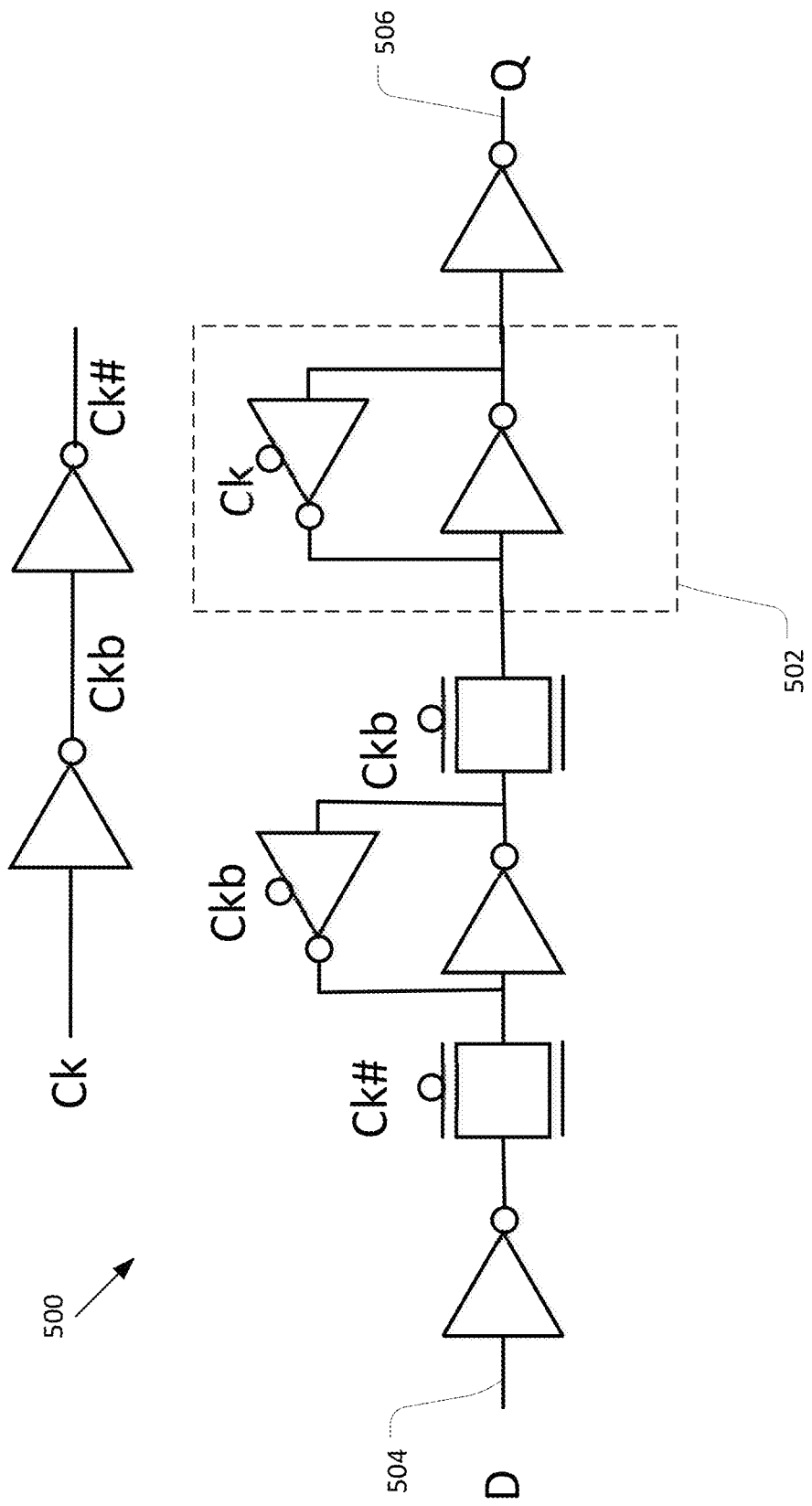
FIG. 5 illustrates a flip-flop circuit that may incorporate the cross-couple circuit of FIG. 4, in accordance with various embodiments.

FIG. 5 illustrates, for one embodiment, a master-slave flip-flop circuit 500 with a slave cross-couple stage 502 that may correspond to the cross-couple circuit 400. The flip-flop circuit 500 may include an input (D) 504 and an output (Q) 506. The remaining components and functionality of the master-slave flip-flop circuit 500, as shown in FIG. 5, will not be further explained here.

It will be apparent that other embodiments of the flip-flop circuit 500 may include different components and/or topology. The cross-couple circuit 400 may additionally or alternatively be used in a register file circuit as further described below, and/or another type of circuit in which save-restore functionality is desired.

The cross-couple circuit 400 may include a pair of cross-coupled inverters 402a and 402b coupled between a bit node 404 and a bit bar node 406. The cross-couple circuit 400 may further include save-restore circuitry 408a and 408b coupled to the bit node 404 and bit bar node 406, respectively. The save-restore circuitry 408a may include a transmission gate 410 coupled between an internal node bitnv and the bit node 404 to enable the save-restore circuitry 408a to be electrically uncoupled from the bit node 404 during normal operation of the flip-flop circuit (e.g., when the circuitry that includes the flip-flop circuit is powered on). The transmission gate 410 may be a transistor and/or another type of transmission gate to selectively conductively couple the internal node bitnv with the bit node 404. Save-restore circuitry 408a may further include an MFM device 412 coupled between a plate line (PL) 414 and the internal node bitnv. The MFM device 412 may correspond to the MFM device 100 in some embodiments.

In various embodiments, a second MFM device 416 may be coupled between the internal node bitnv and ground (e.g., with the plate line terminal coupled to ground) to act as a capacitive load, as further discussed below. The second MFM device 416 may be a similar size/polarization to the first MFM device 412. In some embodiments, another type of capacitive load may be used instead of the MFM device 416. For example, a conventional capacitor may be used, and/or the capacitance of the bit node 404 may be used for the capacitive load. It may be desirable for the capacitive load (e.g., the second MFM device 416) to have a similar capacitance value to the MFM device 412 to provide charge-sharing. For example, the capacitive load may have a capacitance value from 0.2 to 5 times the capacitance value of the MFM device 412. In some embodiments, the MFM devices 412 and 416 may have the same structure and dimensions.

In some embodiments, the save-restore circuitry 408a may further include a selector device (e.g., transistor) 418 coupled between the internal node bitnv and ground. The selector device 418 may selectively couple the internal node bitnv to ground responsive to a discharge initialization (discinit) signal.

In various embodiments, the save-restore circuitry 408b may include similar components to the save-restore circuitry 408a, and may be coupled to the bit bar node 406. For example, the save-restore circuitry 408b may include a transmission gate 420 coupled between the bit bar node 406 and a internal node bitbnv, an MFM device 422 coupled between the internal node bitbnv and a plate line 424 (which may be coupled with and/or part of the same plate line as plate line 414 to receive the same plate line signal), an MFM device 426 coupled between the internal node bitbnv and ground to provide a capacitive load, and a selector device (e.g., transistor) 428 coupled between the internal node bitbnv and ground and configured to selectively couple the internal node bitbnv to ground responsive to the discinit signal.

Figure 6:
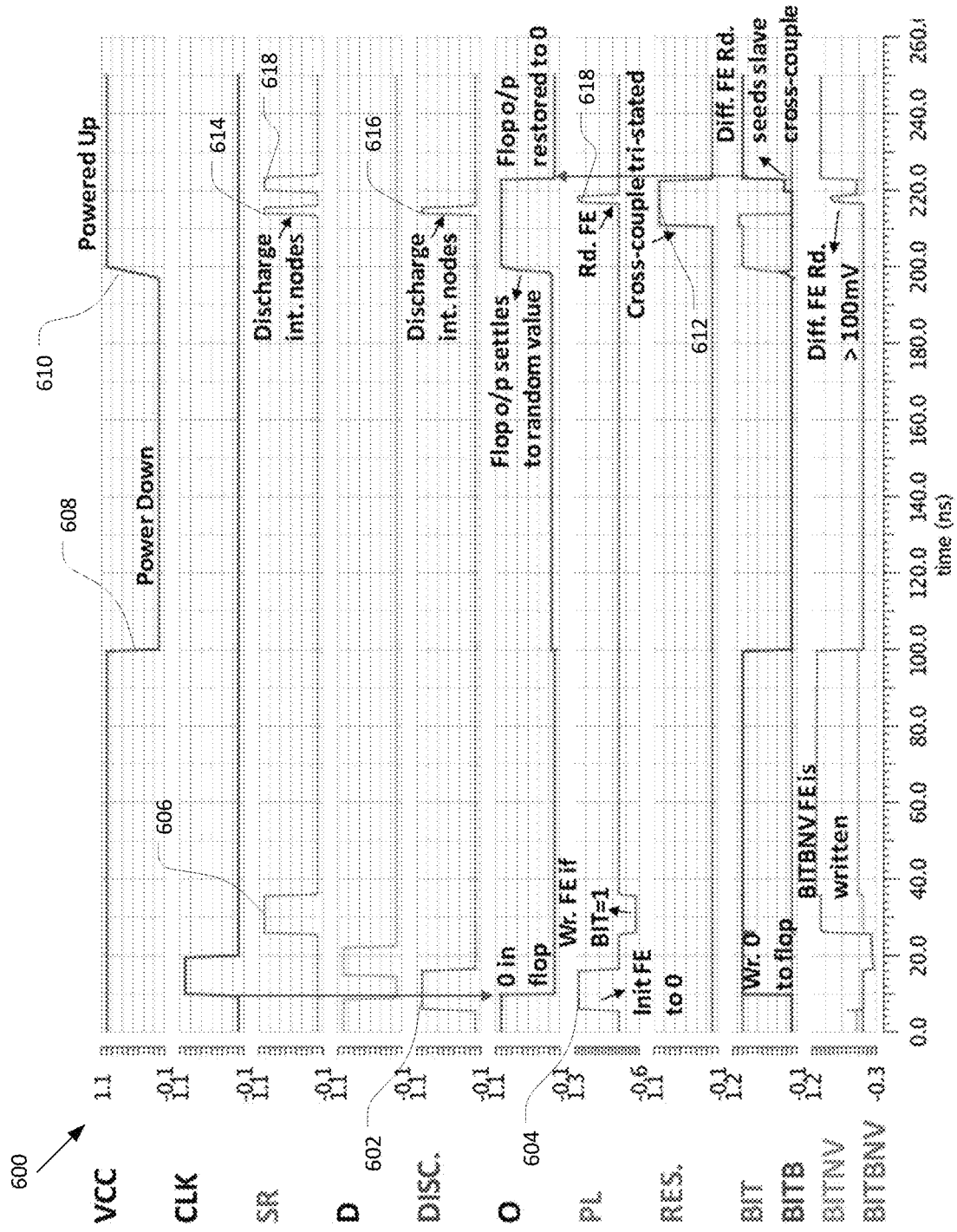
FIG. 6 is a timing diagram that illustrates voltage-time plots of signals of the cross-couple circuit of FIG. 4 and/or the flip-flop circuit of FIG. 5 for a save-restore process when the data bit is logic 0, in accordance with various embodiments.
Figure 7:
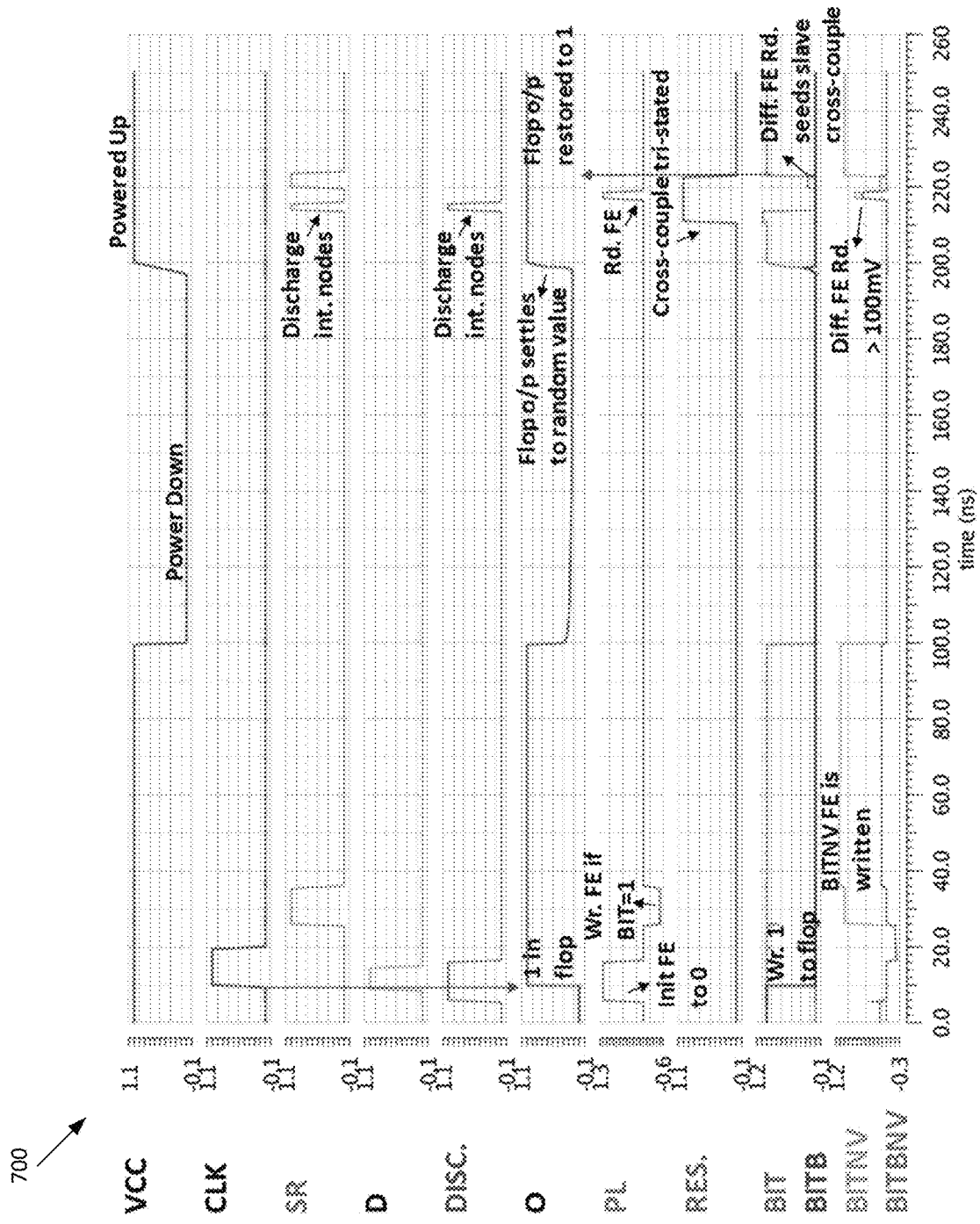
FIG. 7 is a timing diagram that illustrates voltage-time plots of signals of the cross-couple circuit of FIG. 4 and/or the flip-flop circuit of FIG. 5 for a save-restore process when the data bit is logic 1, in accordance with various embodiments.

The save-restore process for the cross-couple circuit 400 will be described with reference to timing diagram 600 shown in FIG. 6. Timing diagram 600 shows various signals associated with the cross-couple circuit 400 and/or flip-flop circuit 500 when the data bit is logic 0 (e.g., the state of the bit node 404 is logic 0 and the state of the bit bar node 406 is logic 1). Additionally, FIG. 7 illustrates a timing diagram 700 that shows the various signals during the save-restore process when the data bit is logic 1 (e.g., the state of the bit node 404 is logic 1 and the state of the bit bar node is logic 0). It will be apparent that the signals shown in FIG. 6 and FIG. 7 are merely examples, and other embodiments may include suitable modifications to the signals shown in FIGS. 6 and 7 to carry out the techniques described herein. As shown, FIGS. 6 and 7 illustrate the power-rail VCC, the clock signal CLK (which is passed to a NOR gate with the restore signal, with the output of the NOR gate going to the control terminal of the inverter 402a), the save-restore (SR) signal, the input (D) of the flip-flop, the output (O) of the flip-flop, the discharge initialization signal DISCINIT (shown as DISC. in FIGS. 6 and 7), the plate line signal PL, the restore signal (RES.), the bit signal (BIT) at the bit node 404, the bit bar signal (BITB) at the bit bar node 406, the voltage at the internal node bitnv of save-restore circuitry 408a, and the voltage at the internal node bitbnv of save-restore circuitry 408b.

In some embodiments, the MFM devices 412 and 422 may be initialized to logic 0 and/or the internal nodes bitnv and bitbnv may be initialized to ground (e.g., 0 volts). This may be performed at any time before performing the other operations of the save-restore process, since it does not affect the flip-flop circuit's normal operation. For example, the selector devices 418 and 428 may be turned on by the discinit signal (e.g., at 602 in FIG. 6) to couple the internal nodes bitnv and bitbnv to ground and the plate lines 414 and 424 may be at the write 0 voltage (e.g., at 604 in FIG. 6) to write logic 0 to the MFM devices 412 and 422.

After the initialization, the save operation may be performed to write one of the MFM device 412 or MFM device 422 to logic 1 based on the value of the bit node 404 and/or bit bar node 406. For example, the MFM device 412 may be coupled to the bit node 404 (e.g., by the transmission gate 410 responsive to the SR signal at 606) and MFM device 422 may be coupled to the bit bar node 406 (e.g., by the transmission gate 420 responsive to the SR signal). The PL signal may go to the write 1 voltage (e.g., −0.3 V) so that whichever of the logic levels of the bit node 404 or bit bar node 406 is logic 1 will cause the respective MFM device 412 or 422 to store a logic 1 while the other of the MFM device 412 or 422 remains at logic 0. For example, as shown in FIG. 6, the internal node bitbnv settles to logic 1 while the internal node bitnv settles to logic 0 since the bit node 404 is logic 0 and the bit bar node 406 is logic 1. In contrast, as shown in FIG. 7, when the bit node 404 is logic 1 and the bit bar node 406 is logic 0, the save operation may cause the internal node bitnv to settle to logic 1 while the internal node bitbnv settles to logic 0.

In various embodiments, after the save operation stores the state of the bit node 404 and bit bar node 406, the circuitry may be powered down to enter sleep mode (e.g., VCC may be lowered to a sleep mode voltage, such as 0 volts, as shown at 608 of FIG. 6). During sleep mode, the MFM device 412 and MFM device 422 may differentially store the state of the cross-coupled inverters 402a and 402b as polarization charge (e.g., MFM device 412 may store the state of the bit node 404 and MFM device 422 may store the state of the bit bar node 406).

Thereafter, the circuit 400 may transition from the sleep mode back to active mode (e.g., a wakeup operation). Accordingly, the VCC may transition back from the sleep mode voltage to the active mode voltage (e.g., as shown at 610 in FIG. 6). The circuit 400 may perform a restore operation to restore the state of the cross-coupled inverters 402a and 402b (e.g., restore the logic values at the bit node 404 and bit bar node 406). As part of the restore operation, the cross-coupled inverters 402a and 402b may be tri-stated (e.g., using control signals restore and restoreb, respectively, as shown at 612 of FIG. 6) to disable the regenerative feedback of the cross-coupled inverters 402a and 402b. While the cross-coupled inverters 402a-b are tri-stated, the internal node bitnv, internal node bitbnv, bit node 404, and bit bar node 406 may be initialized to ground (logic 0), e.g., by turning on the transmission gates 410 and 420 (with the SR signal as shown at 614 of FIG. 6) and the selector devices 418 and 428 (with the discinit signal as shown at 616 of FIG. 6).

The initialization operation enables the circuit 400 to perform the restore operation independent of the power-rail (VCC) transition (e.g., after the power rail transition as shown in FIG. 6), based on input control signals. This provides several potential advantages, including enabling save-restore operations in the flip-flop circuit to be used for purposes other than power management, and/or eliminating the need for any control signals that have to arrive before the main power rail (VCC) is powered back on. In other embodiments, the initialization operation may not be performed, e.g., as described in more detail with respect to FIG. 8 below.

In various embodiments, the restore operation may further include reading the polarization charge in the MFM devices 412 and 422 (e.g., in a differential manner). The read operation may be performed responsive to the plate line signal (e.g., as shown at 618). During a first portion of the read operation, charge-sharing may occur between the MFM device 412 and MFM device 416 to provide a first voltage on the internal node bitnv based on the polarization charge of the MFM device 412. Charge-sharing may also occur between the MFM device 422 and MFM device 426 to provide a second voltage on the internal node bitbnv based on the polarization charge of the MFM device 422. The differential between the first voltage and the second voltage may correspond to the logic values stored by the respective MFM devices 412 and 422. The first portion of the read operation may be performed with the transmission gates off, so the MFM devices 412 and 422 are not conductively coupled to the bit node 404 and bit bar node 406, respectively.

In a second portion of the read operation, the transmission gates 410 and 420 may then be turned on (e.g., responsive to the SR signal as shown at 620) to cause the internal node bitnv and internal node bitbnv seed the bit node 404 and bit bar node 406, respectively, with a differential voltage. In a third portion of the read operation, the regenerative feedback of the cross-coupled inverters 402a-b may then be enabled (e.g., by the restore and restoreb signals), and the differential voltage at the bit node 404 and bit bar node 406 may cause the bit node 404 and bit bar node 406 to settle to the correct logic values, thereby restoring the state of the cross-coupled inverters 402a-b.

Accordingly, the circuit 400 enables save-restore operation for a flip-flop circuit (e.g., flip-flop circuit 500). The circuit 400 provides several advantages over prior flip-flop circuits. For example, the circuit 400 enables in-place save-restore, provides reduced latency for switching between sleep state and active state (e.g., nanosecond scale vs. microsecond scale), provides reduced energy cost for switching between sleep state and active state, and/or provides reduced standby power for holding the data during the sleep state.

Figure 8:
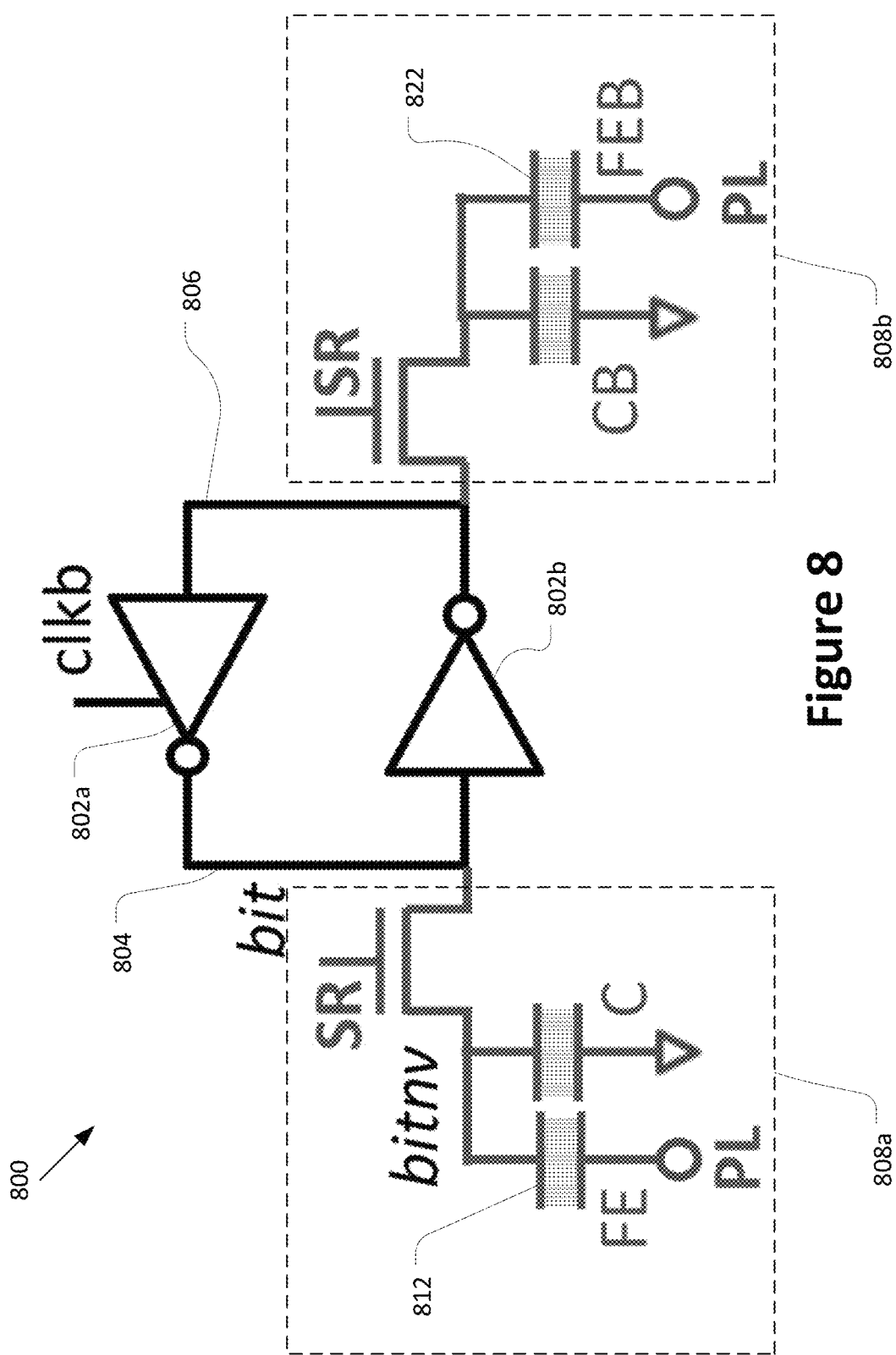
FIG. 8 illustrates another cross-couple circuit including save-restore circuitry, in accordance with various embodiments.

FIG. 8 illustrates another cross-couple circuit 800 with save-restore circuitry 808a-b, in accordance with various embodiments. The cross-couple circuit 800 may be incorporated into the flip-flop circuit 500 in some embodiments, e.g., as an alternative to the cross-couple circuit 400. The cross-couple circuit 800 includes similar components to the flip-flop circuit 400, except that the cross-couple circuit 800 does not include the selector devices 418 and 425. Additionally, the cross-coupled inverters 802a-b may not be tri-stated by the restore and restoreb signals, as described above with respect to the circuit 400.

Accordingly, the cross-couple circuit 800 may not perform the initialization operation prior to storing the state of the cross-coupled inverters 802a-b in the MFM devices 812 and 822. Additionally, the logic values stored by the MFM devices 812 and 822 may be read prior to ramping the supply rail VCC back to normal supply voltage when the circuit 800 wakes up to transition from the sleep state to the active state. The logic values may be restored to the bit node 804 and bit bar node 806 when the power rail VCC ramps up from the sleep mode voltage to the active mode voltage. The circuit 800 may require control signals that operate from a different power supply since the control signals need to be used prior to ramping the power rail VCC. This may present a challenge for flip-flop circuits.

Figure 9:
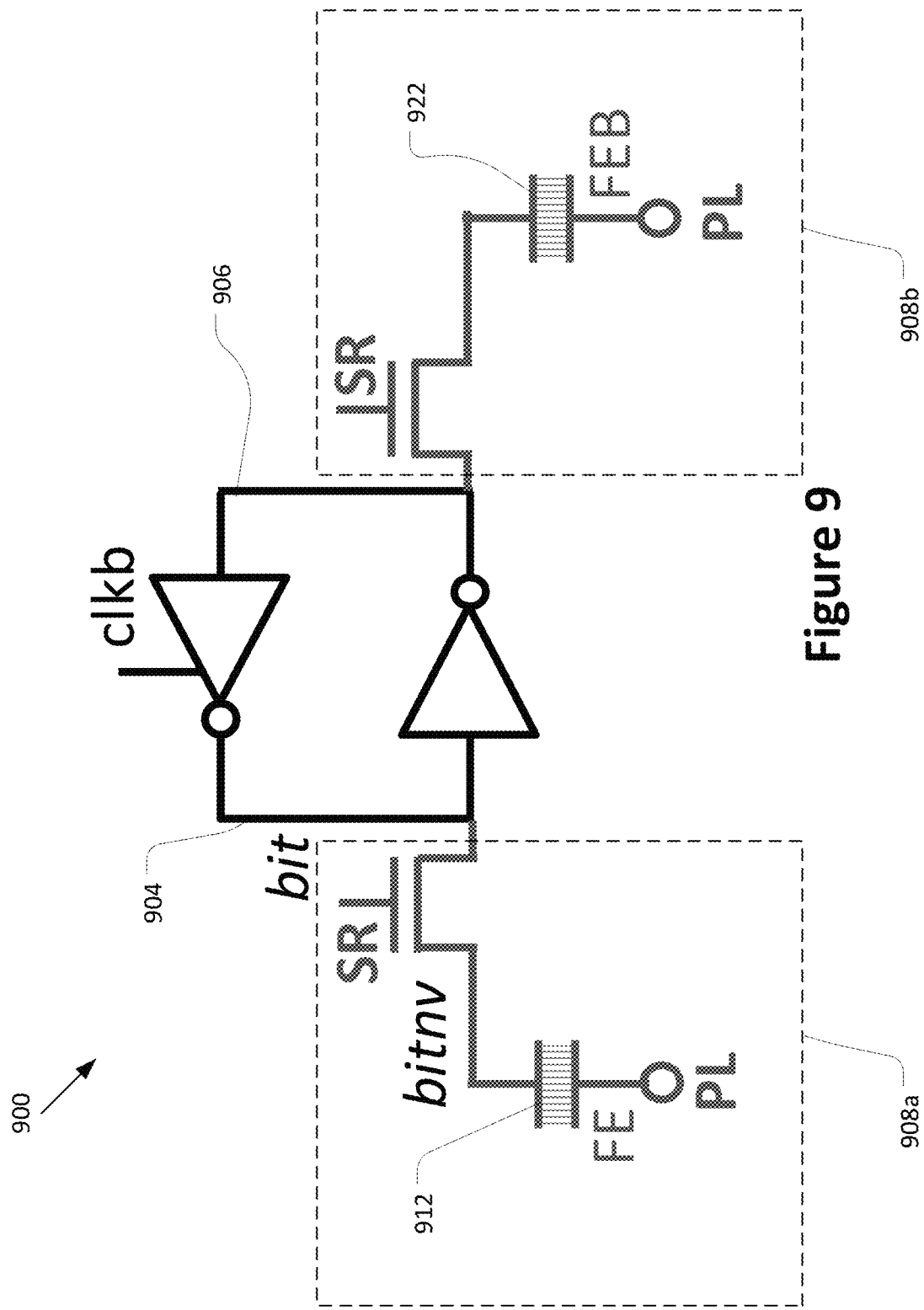
FIG. 9 illustrates yet another cross-couple circuit including save-restore circuitry, in accordance with various embodiments.

FIG. 9 illustrates another cross-couple circuit 900 with save-restore circuitry 908a-b, in accordance with various embodiments. The cross-couple circuit 900 may be incorporated into the flip-flop circuit 500 in some embodiments, e.g., as an alternative to the cross-couple circuit 400 and/or 800. The cross-couple circuit 900 includes similar components to the cross-couple circuit 900, except that the cross-couple circuit 900 does not include the selector devices 418 and 425 or the MFM devices 416 and 426 to provide capacitive loads. The cross-couple circuit 900 may use the inherent capacitance of the bit node 904 and bit bar node 906 to provide the respective capacitive loads for charge-sharing with the MFM devices 912 and 922. This may be possible, for example, when the ratio of the capacitance of the bit node 904 to the MFM device 912 is between 0.2:1 to 1:5. The cross-couple circuit 900 may otherwise operate similar to the cross-couple circuit 800, as described above.

Figure 10:
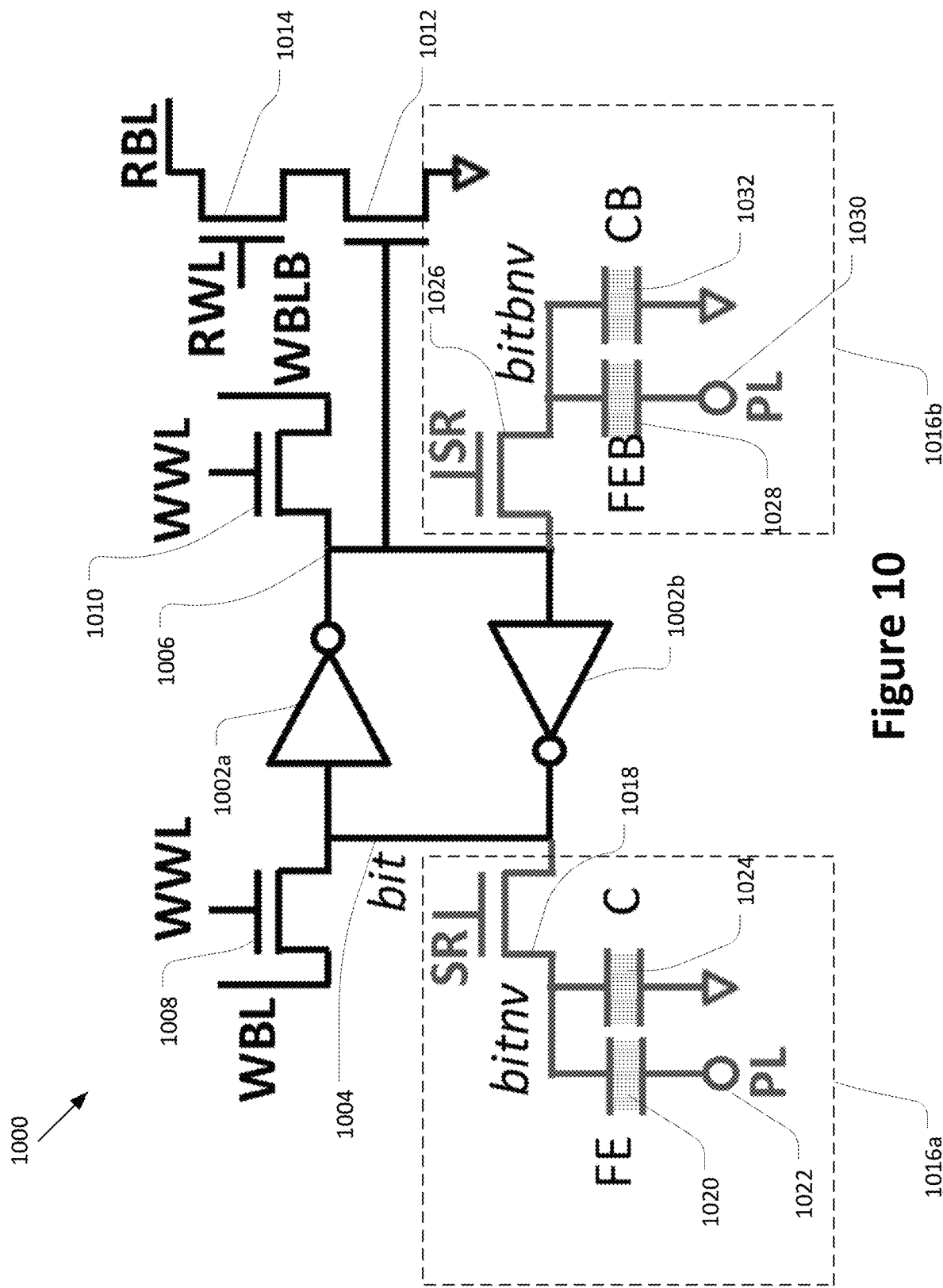
FIG. 10 illustrates a register file circuit including save-restore circuitry, in accordance with various embodiments.

FIG. 10 illustrates a register file circuit 1000 (hereinafter "circuit 1000") with save-restore functionality, in accordance with various embodiments. The circuit 1000 may include an RF bitcell 1001 and save-restore circuitry 1016a-b coupled to the RF bitcell 1001 to provide save-restore functionality. The RF bitcell 1001 may include a first inverter 1002a and a second inverter 1002b that are cross-coupled between a bit node 1004 and a bit bar node 1006. The RF bitcell 1001 may include write circuitry that includes a transistor 1008 coupled between the bit node 1004 and a write bit line (WBL). The gate terminal of the transistor 1008 may be coupled to a write word line (WWL). Accordingly, during a write operation, the transistor 1008 may be responsive to the WWL to selectively couple the bit node 1004 to the WBL and thereby write the logic value of the WBL to the bit node 1004. The write circuitry may further include a transistor 1010 coupled between the bit bar node 1006 and a write bit line bar (WBLB). The gate terminal of the transistor 1010 may be coupled to the WWL. Accordingly, during the write operation, the transistor 1010 may be responsive to the WWL to selective couple the bit bar node 1006 to the WBLB and thereby write the logic value of the WBLB to the bit bar node 1006.

The RF bitcell 1001 may further include read circuitry to read the logic value stored by the bit node 1004 and/or bit bar node 1006. For example, as shown in FIG. 10, the read circuitry may include transistors 1012 and 1014. Transistor 1014 may have a gate terminal coupled to a read word line (RWL) and a terminal coupled to a read bit line (RBL). The transistor 1012 may be coupled between the other terminal of the transistor 1014 and ground, with a gate terminal of the transistor 1012 coupled to the bit bar node 1006.

The circuit 1000 may further include save-restore circuitry 1016a coupled to the bit node 1004 and/or save-restore circuitry 1016b coupled to the bit bar node 1006. The save-restore circuitry 1016a-b may be similar to save-restore circuitry 808a-b of FIG. 8. It will be apparent that the save-restore circuitry 1016a-b may be used with other types of RF bitcells, e.g., with different designs of write circuitry and/or read circuitry.

The save-restore circuitry 1016a may include a transmission gate 1018 coupled between the bit node 1004 and an internal node bitnv. An MFM device 1020 may be coupled between the internal node bitnv and a plate line 1022. Another MFM device 1024 may be coupled between the internal node bitnv and ground to provide a capacitive load for charge-sharing with the MFM device 1020.

The save-restore circuitry 1016b may include a transmission gate 1026 coupled between the bit bar node 1006 and an internal node bitbnv. An MFM device 1028 may be coupled between the internal node bitbnv and a plate line 1030 (with may be coupled with the plate line 1022 and/or configured to receive the same plate line signal). Another MFM device 1032 may be coupled between the internal node bitbnv and ground to provide a capacitive load for charge-sharing with the MFM device 1028.

Figure 11:
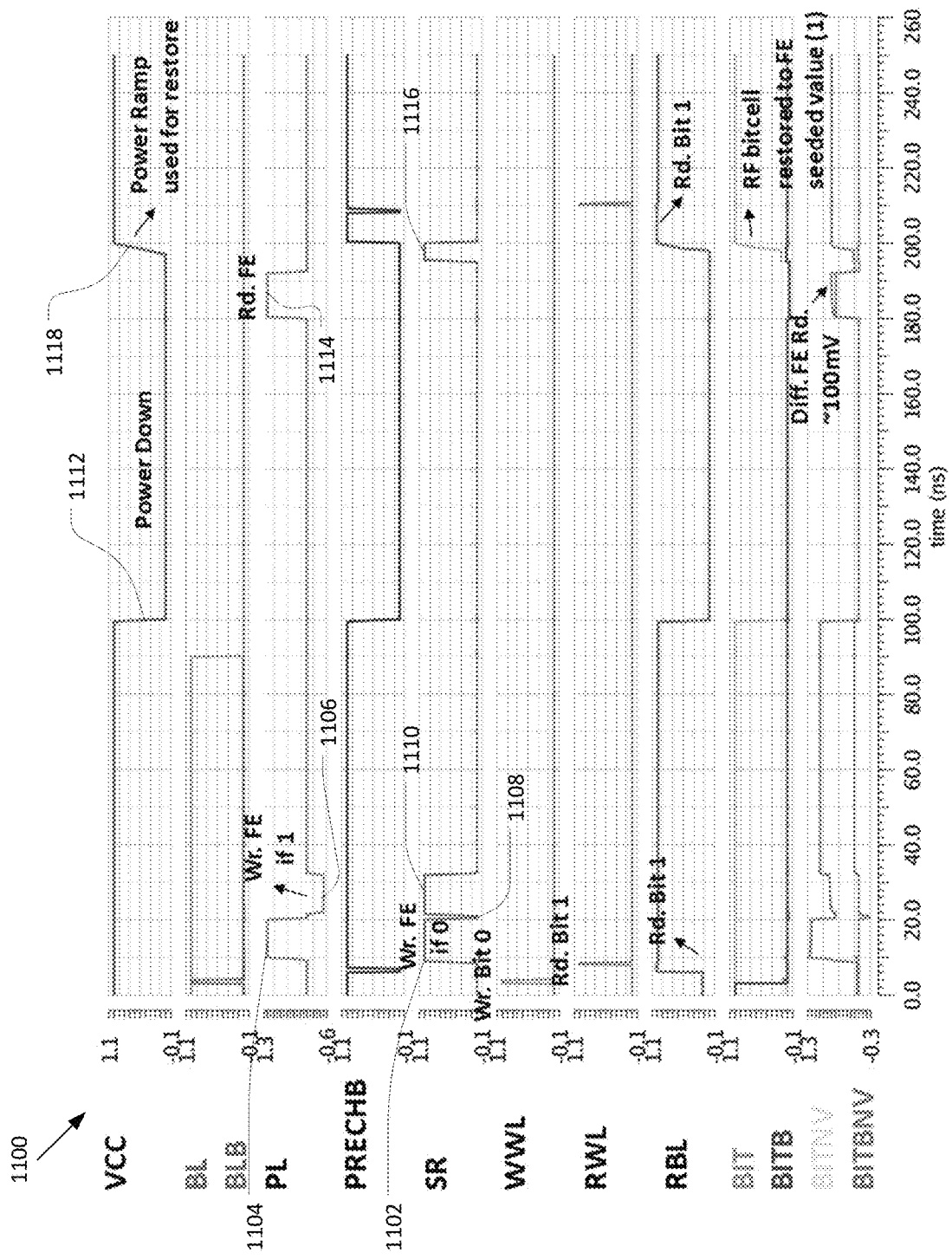
FIG. 11 is a timing diagram that illustrates voltage-time plots of signals of the register file circuit of FIG. 10 for a save-restore process when the data bit is logic 1, in accordance with various embodiments.
Figure 12:
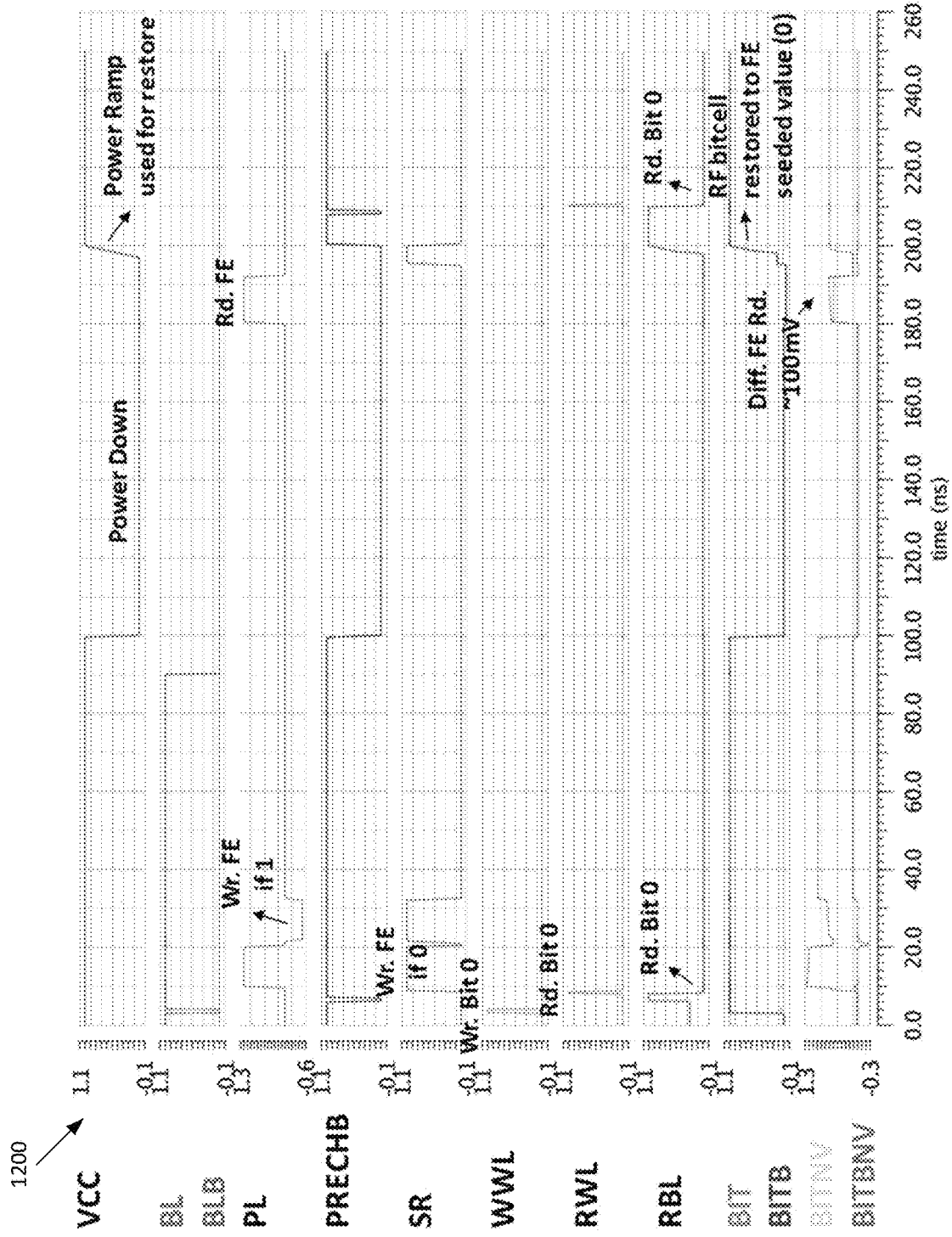
FIG. 12 is a timing diagram that illustrates voltage-time plots of signals of the register file circuit of FIG. 10 for a save-restore process when the data bit is logic 0, in accordance with various embodiments.

FIG. 11 illustrates waveforms of various signals during a save-restore process performed by the circuit 1000 when the value of BIT is 1 (e.g., bit node 1004 is logic 1 and bit bar node is logic 0). FIG. 12 illustrates waveforms of the various signals during the save-restore process when the value of BIT is 0 (e.g., bit node 1004 is logic 0 and bit bar node 1006 is logic 1). The save-restore process is the same for both values of BIT, except that the opposite values are written to the respective MFM devices 1020 and 1028.

The save-restore process includes saving the state of the bit node 1004 and bit bar node 1006 when the circuit 1000 transitions from an active mode (e.g., normal operation) to a sleep mode, holding the state while the circuit 1000 is in the sleep mode, and restoring the state to the bit node 1004 and 1006 when the circuit 1000 transitions from the sleep mode back to the active mode. The save-restore process performed by the circuit 1000 may be similar to the save-restore process performed by the circuit 800 described above. That is, the save-restore circuitry 1016a-b may not include a selector device between the internal nodes bitnv and bitbnv and ground. In some embodiments, the save-restore circuitry 1016a-b may not initialize the voltage at the internal nodes bitnv and bitbnv as part of the restore operation, and/or may not initialize the voltage at the internal nodes bitnv and bitbnv, the bit node 1004, and/or the bit bar node 1006 as part of the restore operation. Furthermore, the save-restore circuitry 1016a-b may perform the restore operation using the ramp-up of the power-rail VCC to re-engage the regenerative feedback of the cross-coupled inverters 1002a-b and restore the state of the bit node 1004 and bit bar node 1006 based on the polarization charge stored by the MFM devices 1020 and 1028. This allows for circuit optimization to lower overhead. While using the power-rail ramp to perform the restore is challenging to support in standard cell logic such as in flip-flops, it is practical to support it in register files compiled from custom-designed cells.

In various embodiments, the save-restore circuitry 1016a-b may be isolated from the RF bitcell 1001 during normal operation (e.g., by the respective transmission gates 1018 and 1026). When the circuit 1000 transitions from an active mode (normal operation) to a sleep mode, the MFM devices 1020 and 1028 may differentially store the state of the cross-coupled inverters 1002a-b (e.g., the logic values at the bit node 1004 and bit bar node 1006, respectively).

In some embodiments, the save operation may include a first save operation in which a logic 0 is written to one of the MFM device 1020 or 1028 based on the state of the bit node 1004 and bit bar node 1006, and a second save operation in which a logic 1 is written to the other one of the MFM device 1020 or 1028 based on the state of the bit node 1004 and bit bar node 1006. For example, as part of the first save operation, the transmission gates 1018 and 1026 may turn on responsive to the SR signal (at 1102 in FIG. 11) to couple the MFM devices 1020 and 1028 to the bit node 1004 and bit bar node 1006, respectively. At the same time, the plate line signal may be the write 0 voltage (e.g., at 1104 in FIG. 11). Accordingly, one of the MFM 1020 or MFM 1028 is written to logic 0 based on the state of the bit node 1004 and/or bit bar node 1006 (whichever of the MFM 1020 or MFM 1028 is coupled to the bit node 1004 or bit bar node 1006 that is logic 0). For example, if BIT=1, as shown in FIG. 11, then the MFM device 1028 that is coupled to bit bar node 1006 is written to logic 0. If BIT=0, as shown in FIG. 12, then the MFM device 1020 that is coupled to the bit node 1004 is written to logic 0.

Subsequently, as part of the second save operation, the plate line signal may transition to the logic 1 write voltage (e.g., at 1106 in FIG. 11). In some embodiments, the transmission gates may be turned off while the plate line signal transitions from the logic 0 write voltage to the logic 1 write voltage (e.g., responsive to the SR signal as shown at 1108 in FIG. 11) before turning back on when the plate line signal is at the logic 1 write voltage (e.g., at 1110 in FIG. 11). During the second save operation, the other one of the MFM device 1020 or 1028 may be written to logic 1 based on the state of the bit node 1004 and/or bit bar node 1006 (whichever of the MFM 1020 or MFM 1028 is coupled to the bit node 1004 or bit bar node 1006 that is logic 1). For example, if BIT=1, as shown in FIG. 11, then the MFM device 1020 that is coupled to bit node 1004 is written to logic 1. If BIT=0, as shown in FIG. 12, then the MFM device 1028 that is coupled to the bit bar node 1006 is written to logic 1.

In other embodiments, the first and second save operations may be performed in the opposite order. That is, one of the MFM devices 1020 or 1028 may be written to logic 1 and then the other of the MFM devices 1020 or 1028 may be written to logic 0.

After the state of the bit node 1004 and bit bar node 1006 have been written to the respective MFM device 1020 and 1028, the power rail (VCC) may be powered down to the sleep mode voltage (e.g., 0 volts), as shown at 1112 in FIG. 11. The MFM devices 1020 and 1028 may hold the state of the bitcell 1001 while the circuit 1000 is in sleep mode.

Before the power rail VCC is ramped back to the active mode voltage, the restore operation begins, to restore the state of the bit node 1004 and bit bar node 1006. The restore operation may be initiated based on an indication from the power management circuit that the bitcell 1001 will transition from the sleep mode to the active mode.

In various embodiments, the restore operation may include reading the polarization charge in the MFM devices 1020 and 1028 (e.g., in a differential manner). The plate line signal may provide the read voltage as part of the read operation, e.g., as shown at 1114 in FIG. 11. During the read operation, charge-sharing may occur between the MFM device 1020 and MFM device 1024 to provide a first voltage on the internal node bitnv based on the polarization charge of the MFM device 1020. Charge-sharing may also occur between the MFM device 1028 and MFM device 1032 to provide a second voltage on the internal node bitbnv based on the polarization charge of the MFM device 1028. The differential between the first voltage and the second voltage may correspond to the logic values stored by the respective MFM devices 1020 and 1028.

The transmission gates 1018 and 1026 may then be turned on (e.g., at 1116 of FIG. 11) to cause the internal node bitnv and internal node bitbnv seed the bit node 1004 and bit bar node 1006, respectively, with a differential voltage. The power-rail VCC may then ramp-up (e.g., at 1118), which causes the regenerative feedback of the cross-coupled inverters 1002a-b to be enabled. The differential voltage at the bit node 1004 and bit bar node 1006 may cause the bit node 1004 and bit bar node 1006 to settle to the correct logic values, thereby restoring the state of the bit node 1004 and bit bar node 1006.

Figure 13:
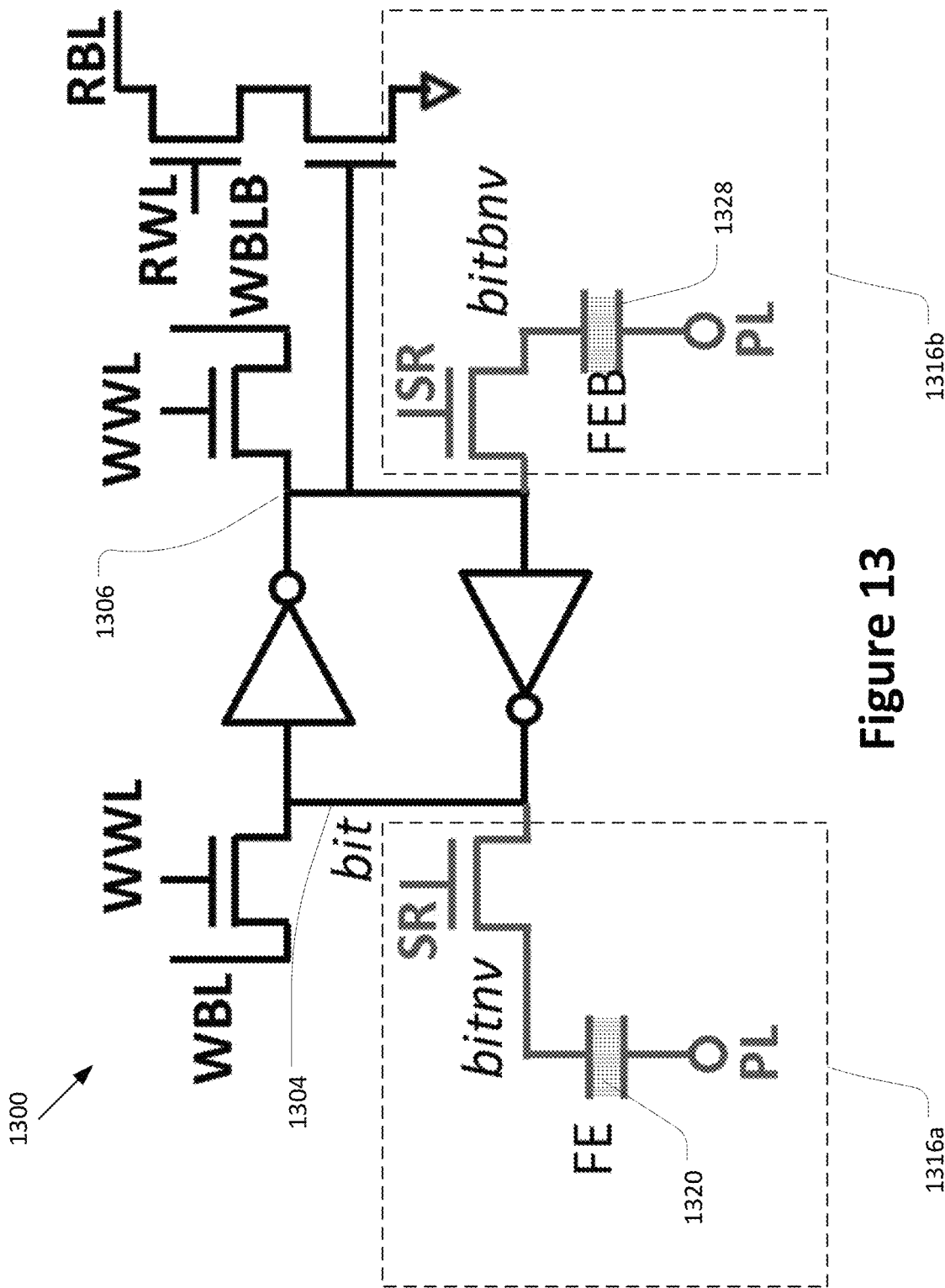
FIG. 13 illustrates another register file circuit including save-restore circuitry, in accordance with various embodiments.

FIG. 13 illustrates an alternative circuit 1300 including a bitcell 1301 and save-restore circuitry 1316a-b. Save-restore circuitry 1316a-b may be similar to save-restore circuitry 1016a-b, except that the save-restore circuitry 1316a-b does not include the MFM devices 1024 and 1032 to provide capacitive loads. The circuit 1300 may use the inherent capacitance of the bit node 1304 and bit bar node 1306 to provide the respective capacitive loads for charge-sharing with the MFM devices 1320 and 1328. The cross-couple circuit 1300 may otherwise operate similar to the cross-couple circuit 1000, as described above.

Referring again to FIG. 1, the MFM device 100 described herein (and utilized in the circuits of FIGS. 3, 4, 5, 8, 9, 10, and 13) may include any suitable materials. For example, the first electrode 102 and/or second electrode 104 may include one or more metals, such as a conductive oxide. In some embodiments, first electrode 102 and/or second electrode 104 may include one or more of: TiN, TaN, Ta, W, Ag, Au, Al, Co, Cu, Graphene, Sr, Ru, La, Sr, Mn, Nb, Cr, or O. In some embodiments, first electrode 102 and/or second electrode 104 may include one or more of: SrRuO3, (La,Sr)CoO3 [LSCO], La0.5Sr0.5Mn1−xNixO, Cu-doped SrFe0.9Nb0.1O3, or (La,Sr)CrO3.

The ferroelectric material 106 may include any suitable ferroelectric material, such as a material that includes one or more of Ti, Hf, Zr, Al, Nb, La, Sr, or O. In some embodiments, the ferroelectric material 106 includes one or more of: TiAl, Nb doped SrTiO3 (STO), La doped STO, SrTiO3, BiFeO3 (BFO) BiTeO3, BaTiO3, HfZrO2 (HZO), silicon doped hafnium, PZT, SBT, SBO, BFT. In some embodiments, thickness of the layer of ferroelectric material 106 in the MFM device 100 is in the range of 40 Angstroms (Å) to 500 Å. In some embodiments, ferroelectric material includes a super lattice of PbTiO3 (PTO) and SrTiO3 (STO). In some embodiments, the super lattice of PTO and STO is repeated in a range of 2 to 100 times. For example, alternating layers of PTO and STO are repeated 2 to 100 times.

Figure 14:
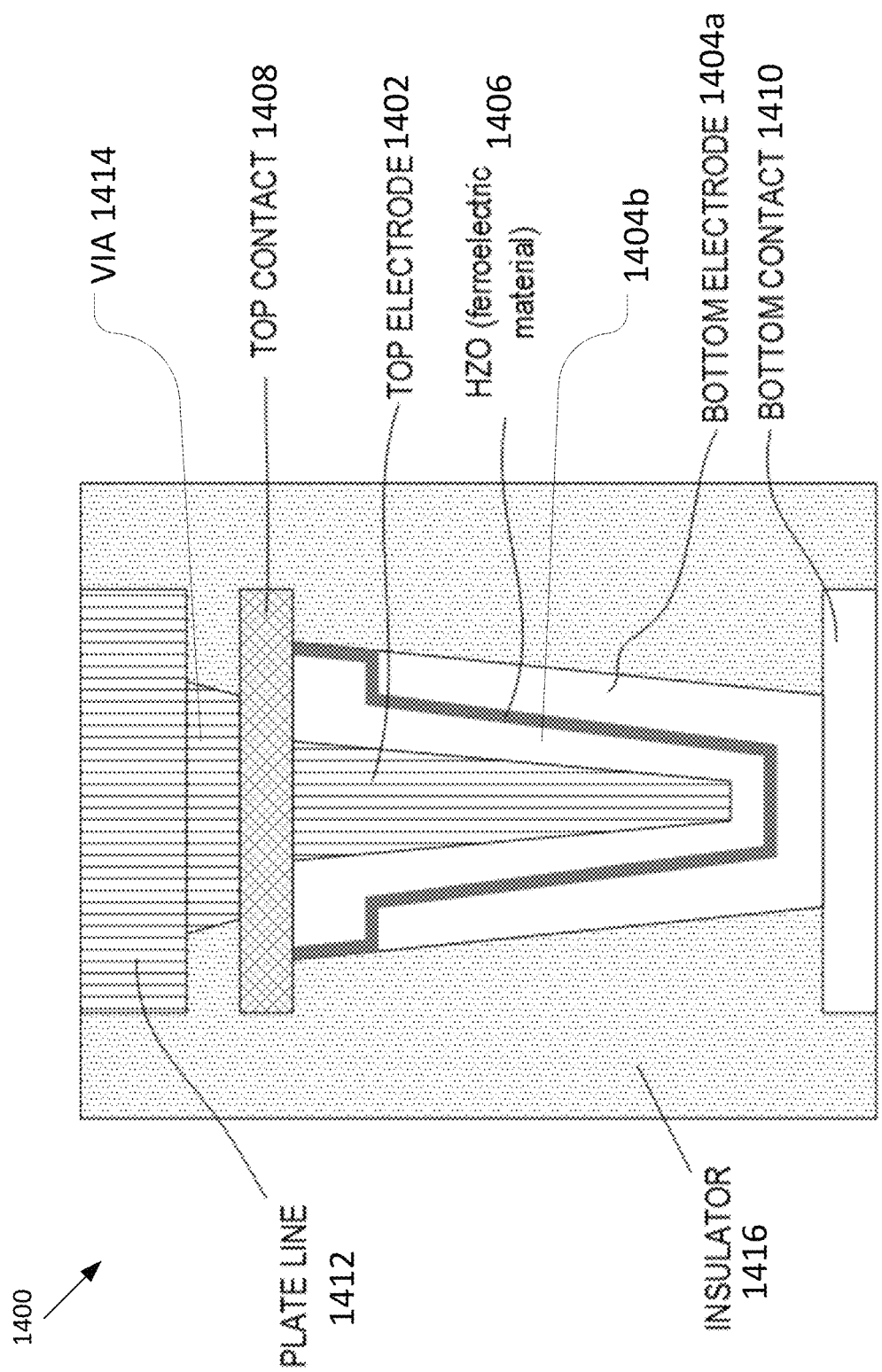
FIG. 14 is a more detailed cross-sectional view of an MFM device, in accordance with various embodiments.

FIG. 14 illustrates a more detailed cross-sectional view of one embodiment of an MFM device 1400 that may correspond to the MFM device 100 in various embodiments. The MFM device 1400 may include a first electrode (e.g., top electrode) 1402, a second electrode (e.g., bottom electrode) 1404, and a ferroelectric material 1406 coupled between the first electrode 1402 and the second electrode 1404. The first electrode 1402, second electrode 1404, and ferroelectric material 1406 may correspond to the first electrode 102, second electrode 104, and ferroelectric material 106, respectively, of FIG. 1. In some embodiments, the second electrode 1404 may include a first portion 1404a and a second portion 1404b. The ferroelectric material 1406 may be between the first portion 1404a and second portion 1404b. The first portion 1404a and second portion 1404b may be the same material and/or different materials (e.g., a conductive oxide as described above).

In various embodiments, the MFM device 1400 may further include a first contact (e.g., top contact) 1408 coupled to the first electrode 1402 and a second contact (e.g., bottom contact) 1410 coupled to the second electrode 1404. In some embodiments, the first contact 1408 may be further coupled to the ferroelectric material 1406 and/or the second portion 1404b of the second electrode, as shown in FIG. 14. The second contact 1410 may be coupled to the second electrode 1404. The first contact 1408 and/or second contact 1410 may include any suitable conductor, such as one or more of TiN, TaN, N, Ta, W, Au, Al, Cu, Ag, Co, or Graphene.

In some embodiments, the first contact 1408 of the MFM device 1400 may be coupled to a plate line 1412 (e.g., by a via 1414). The plate line 1412 may receive the plate line signal as described herein and pass the plate line signal to the first contact 1408. The plate line 1412 may include any suitable conductor, such as one or more of TiN, TaN, N, Ta, W, Au, Al, Cu, Ag, Co, or Graphene.

An insulator 1416 may be coupled to and/or surround the side surface of the second electrode 1404 and/or other components of the MFM device 1400. The insulator 1416 may be a dielectric and/or other suitable insulator.

Figure 15:
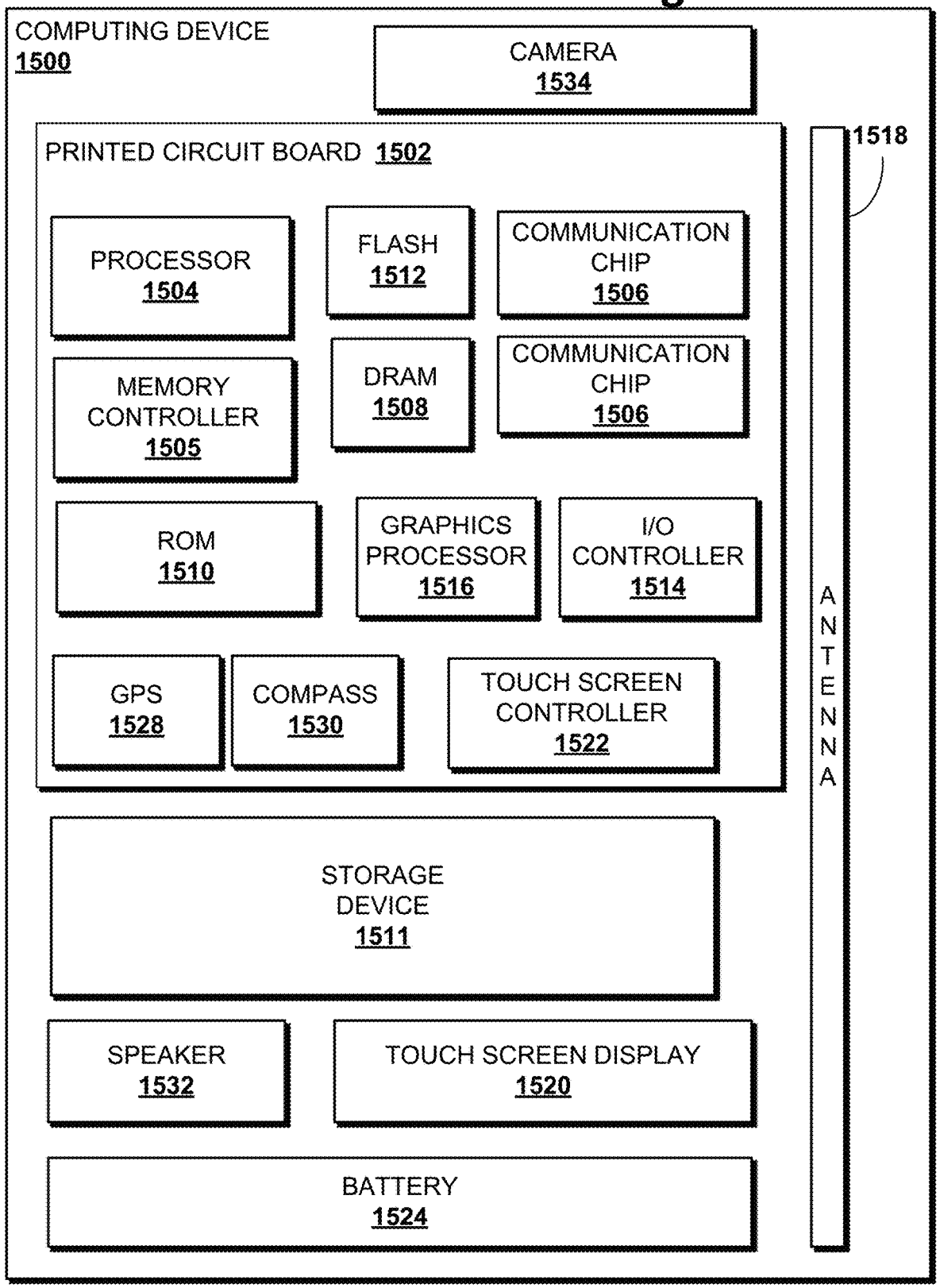
FIG. 15 illustrates an example system configured to employ the apparatuses and methods described herein, in accordance with various embodiments.

FIG. 15 illustrates an example computing device 1500 that may employ the apparatuses and/or methods described herein (e.g., cross-couple circuit 400, flip-flop circuit 500, cross-couple circuit 800, cross-couple circuit 900, register file circuit 1000, and/or register file circuit 1300), in accordance with various embodiments. As shown, computing device 1500 may include a number of components, such as one or more processor(s) 1504 (one shown) and at least one communication chip 1506. In various embodiments, the one or more processor(s) 1504 each may include one or more processor cores. In various embodiments, the at least one communication chip 1506 may be physically and electrically coupled to the one or more processor(s) 1504. In further implementations, the communication chip 1506 may be part of the one or more processor(s) 1504. In various embodiments, computing device 1500 may include printed circuit board (PCB) 1502. For these embodiments, the one or more processor(s) 1504 and communication chip 1506 may be disposed thereon. In alternate embodiments, the various components may be coupled without the employment of PCB 1502.

Depending on its applications, computing device 1500 may include other components that may or may not be physically and electrically coupled to the PCB 1502. These other components include, but are not limited to, memory controller 1505, volatile memory (e.g., dynamic random access memory (DRAM) 1508), non-volatile memory such as read only memory (ROM) 1510, flash memory 1512, storage device 1511 (e.g., a hard-disk drive (HDD)), an I/O controller 1514, a digital signal processor (not shown), a crypto processor (not shown), a graphics processor 1516, one or more antenna 1518, a display (not shown), a touch screen display 1520, a touch screen controller 1522, a battery 1524, an audio codec (not shown), a video codec (not shown), a global positioning system (GPS) device 1528, a compass 1530, an accelerometer (not shown), a gyroscope (not shown), a speaker 1532, a camera 1534, and a mass storage device (such as hard disk drive, a solid state drive, compact disk (CD), digital versatile disk (DVD)) (not shown), and so forth. In various embodiments, the processor 1504 may be integrated on the same die with other components to form a System on Chip (SoC).

In some embodiments, the one or more processor(s) 1504, flash memory 1512, and/or storage device 1511 may include associated firmware (not shown) storing programming instructions configured to enable computing device 1500, in response to execution of the programming instructions by one or more processor(s) 1504, to practice all or selected aspects of the methods described herein. In various embodiments, these aspects may additionally or alternatively be implemented using hardware separate from the one or more processor(s) 1504, flash memory 1512, or storage device 1511.

In various embodiments, one or more components of the computing device 1500 may include the cross-couple circuit 400, flip-flop circuit 500, cross-couple circuit 800, cross-couple circuit 900, register file circuit 1000, and/or register file circuit 1300 described herein. For example, the cross-couple circuit 400, flip-flop circuit 500, cross-couple circuit 800, cross-couple circuit 900, register file circuit 1000, and/or register file circuit 1300 may be included in processor 1504, communication chip 1506, I/O controller 1514, memory controller 1505, and/or another component of computing device 1500. The cross-couple circuit 400, flip-flop circuit 500, cross-couple circuit 800, cross-couple circuit 900, register file circuit 1000, and/or register file circuit 1300 may be used to store data for one or more circuit blocks of the integrated circuit when the one or more circuit blocks are in a sleep state, and to restore the data when the one or more circuit blocks transition from the sleep state to an active state, as described herein.

The communication chips 1506 may enable wired and/or wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi and Bluetooth, and a second communication chip 1506 may be dedicated to longer range wireless communications such as GPS, EDGE, GPRS, CDMA, WiMAX, LTE, Ev-DO, and others.

In various implementations, the computing device 1500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 1500 may be any other electronic device that processes data.

Some non-limiting Examples of various embodiments are provided below.

Example 1 is a circuit comprising: a first inverter and a second inverter cross-coupled between a bit node and a bit bar node; and a save-restore circuit coupled to the bit node. The save-restore circuit includes: a metal-ferroelectric-metal (MFM) device to store a logic value of the bit node when the circuit is in a sleep state and restore the logic value to the bit node when the circuit transitions from the sleep state to an active state; and a transmission gate coupled between the MFM device and the bit node to isolate the MFM device from the bit node when the circuit is in the active state.

Example 2 is the circuit of Example 1, wherein the MFM device is coupled between an internal node and a plate line, wherein the plate line is to receive a control signal to control the MFM device to perform the store and the restore.

Example 3 is the circuit of Example 2, wherein the save-restore circuit further comprises a capacitive load coupled between the internal node and ground.

Example 4 is the circuit of Example 3, wherein the capacitive load is another MFM device.

Example 5 is the circuit of any one of Examples 1-4, wherein the save-restore circuit further comprises a selector device coupled between the internal node and ground to initialize the internal node prior to the store and prior to the restore.

Example 6 is the circuit of any one of Examples 1-5, wherein the first inverter and second inverter are responsive to respective control signals to be tri-stated as part of the restore of the logic value to the bit node.

Example 7 is the circuit of any one of Examples 1-6, wherein the save-restore circuit is a first save-restore circuit, wherein the MFM device is a first MFM device, and wherein the circuit further includes a second save-restore circuit coupled to the bit bar node, the second save-restore circuit including a second MFM device to store a logic value of the bit bar node when the flip-flop circuit is in a sleep state and restore the logic value to the bit bar node when the flip-flop circuit transitions from the sleep state to an active state.

Example 8 is the circuit of Example 7, wherein, during a first store operation, one of the first MFM device or the second MFM device is to store the logic value of the respective bit node or bit bar node based on a state of the bit node and bit bar node, and, during a second store operation that occurs before or after the first store operation, the other one of the first MFM device or the second MFM device is to store the logic value of the respective bit node or bit bar node based on the state of the bit node and bit bar node.

Example 9 is the circuit of any one of Examples 1-8, wherein the circuit is included in a flip-flop circuit.

Example 10 is the circuit of any one of Examples 1-8, wherein the circuit is included in a register file circuit.

Example 11 is a flip-flop circuit comprising: a first inverter and a second inverter cross-coupled between a bit node and a bit bar node; a first metal-ferroelectric-metal (MFM) device coupled between an internal node and a plate line, the first MFM device to store a logic value of the bit node when the flip-flop circuit is in a sleep state and restore the logic value to the bit node when the flip-flop circuit transitions from the sleep state to an active state; a second MFM device coupled between the internal node and ground to provide charge-sharing with the first MFM device for the restore; and a transmission gate coupled between the internal node and the bit node to isolate the first and second MFM devices from the bit node when the flip-flop circuit is in the active state.

Example 12 is the flip-flop circuit of Example 11, wherein the plate line is to receive a control signal to control the MFM device to perform the store and the restore.

Example 13 is the flip-flop circuit of Example 11 or Example 12, further comprising a selector device coupled between the internal node and ground to initialize the internal node prior to the store and prior to the restore.

Example 14 is the flip-flop circuit of any one of Examples 11 to 13, wherein the first inverter and second inverter are responsive to respective control signals to be tri-stated as part of the restore of the logic value to the bit node.

Example 15 is the flip-flop circuit of any one of Examples 11 to 14, wherein the MFM device and transmission gate are included in a first save-restore circuit coupled to the bit node, and wherein the flip-flop circuit further includes a second save-restore circuit coupled to the bit bar node.

Example 16 is a register file circuit comprising: a bitcell having a bit node and a bit bar node; a first metal-ferroelectric-metal (MFM) device coupled between an internal node and a plate line, the first MFM device to store a logic value of the bit node when the flip-flop circuit is in a sleep state and restore the logic value to the bit node when the flip-flop circuit transitions from the sleep state to an active state; a second MFM device coupled between the internal node and ground to provide charge-sharing with the first MFM device for the restore; and a transmission gate coupled between the internal node and the bit node to isolate the first and second MFM devices from the bit node when the flip-flop circuit is in the active state.

Example 17 is the register file circuit of Example 16, wherein the plate line is to receive a control signal to control the MFM device to perform the store and the restore.

Example 18 is the register file circuit of Example 16 or Example 17, wherein the first MFM device, the second MFM device, and the transmission gate are included in a first save-restore circuit coupled to the bit node, and wherein the flip-flop circuit further includes a second save-restore circuit coupled to the bit bar node, the second save-restore circuit including a third MFM device and a fourth MFM device.

Example 19 is the register file circuit of Example 18, wherein, during a first store operation, one of the first MFM device or the third MFM device is to store the logic value of the respective bit node or bit bar node based on a state of the bit node and bit bar node, and, during a second store operation that occurs before or after the first store operation, the other one of the first MFM device or the third MFM device is to store the logic value of the respective bit node or bit bar node based on the state of the bit node and bit bar node.

Example 20 is the register file circuit of any one of Examples 16-19, wherein the restore is performed using a global power rail of the register file circuit that is at an active mode voltage during the active mode and at a sleep mode voltage during the sleep mode.

Example 21 is a computer system comprising: a battery; one or more antennas; and a processor coupled to the battery and the one or more antennas, the processor including: a logic circuit; a power management circuit to switch the logic circuit between an active state and a sleep state; a circuit coupled to the logic circuit to store data for the logic circuit while the logic circuit is in the sleep state and restore the data when the logic circuit transitions from the sleep state to the active state. The circuit includes: a first inverter and a second inverter cross-coupled between a bit node and a bit bar node; a first metal-ferroelectric-metal (MFM) device coupled between an internal node and a plate line, the first MFM device to store a logic value of the bit node when the logic circuit is in the sleep state and restore the logic value to the bit node when the logic circuit transitions from the sleep state to the active state; a second MFM device coupled between the internal node and ground; and a transmission gate coupled between the internal node and the bit node to isolate the MFM device from the bit node when the logic circuit is in the active state.

Example 22 is the system of Example 21, wherein the save-restore circuit further comprises a selector device coupled between the internal node and ground to initialize the internal node prior to the store and prior to the restore.

Example 23 is the system of Example 21 or Example 22, wherein the first inverter and second inverter are responsive to respective control signals to be tri-stated as part of the restore of the logic value to the bit node.

Example 24 is the system of any one of Examples 21-23, wherein the first MFM device, the second MFM device, and the transmission gate are included in a first save-restore circuit, and wherein the circuit further includes a second save-restore circuit coupled to the bit bar node, the second save-restore circuit including a third MFM device to store a logic value of the bit bar node when the flip-flop circuit is in a sleep state and restore the logic value to the bit bar node when the flip-flop circuit transitions from the sleep state to an active state.

Example 25 is the system of Example 24, wherein, during a first store operation, one of the first MFM device or the third MFM device is to store the logic value of the respective bit node or bit bar node based on a state of the bit node and bit bar node, and, during a second store operation that occurs before or after the first store operation, the other one of the first MFM device or the third MFM device is to store the logic value of the respective bit node or bit bar node based on the state of the bit node and bit bar node.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
    a first inverter and a second inverter cross-coupled between a bit node and a bit bar node;
    a save-restore circuit coupled to the bit node, the save-restore circuit including:
        a metal-ferroelectric-metal (MFM) device to store a logic value of the bit node when the circuit is in a sleep state and restore the logic value to the bit node when the circuit transitions from the sleep state to an active state, wherein the MFM device is coupled between an internal node and a plate line, wherein the plate line is to receive a control signal to control the MFM device to perform the store and the restore;
        a transmission gate coupled between the MFM device and the bit node to isolate the MFM device from the bit node when the circuit is in the active state; and
        a selector device coupled between the internal node and ground to initialize the internal node prior to the store and prior to the restore.

2. The circuit of claim 1, wherein the save-restore circuit further comprises a capacitive load coupled between the internal node and ground.

3. The circuit of claim 1, wherein the capacitive load is another MFM device.

4. The circuit of claim 1, wherein the first inverter and second inverter are responsive to respective control signals to be tri-stated as part of the restore of the logic value to the bit node.

5. The circuit of claim 1, wherein the save-restore circuit is a first save-restore circuit, wherein the MFM device is a first MFM device, and wherein the circuit further includes a second save-restore circuit coupled to the bit bar node, the second save-restore circuit including a second MFM device to store a logic value of the bit bar node when a flip-flop circuit is in a sleep state and restore the logic value to the bit bar node when the flip-flop circuit transitions from the sleep state to an active state.

6. The circuit of claim 5, wherein, during a first store operation, one of the first MFM device or the second MFM device is to store the logic value of the respective bit node or bit bar node based on a state of the bit node and bit bar node, and, during a second store operation that occurs before or after the first store operation, the other one of the first MFM device or the second MFM device is to store the logic value of the respective bit node or bit bar node based on the state of the bit node and bit bar node.

7. The circuit of claim 1, wherein the circuit is included in a flip-flop circuit.

8. The circuit of claim 1, wherein the circuit is included in a register file circuit.

9. A flip-flop circuit comprising:
    a first inverter and a second inverter cross-coupled between a bit node and a bit bar node;
    a first metal-ferroelectric-metal (MFM) device coupled between an internal node and a plate line, wherein the first MFM device is to store a logic value of the bit node when the flip-flop circuit is in a sleep state and restore the logic value to the bit node when the flip-flop circuit transitions from the sleep state to an active state, and wherein the plate line is to receive a control signal to control the first MFM device to perform the store and the restore;
    a second MFM device coupled between the internal node and ground to provide charge-sharing with the first MFM device for the restore;
    a transmission gate coupled between the internal node and the bit node to isolate the first and second MFM devices from the bit node when the flip-flop circuit is in the active state; and
    a selector device coupled between the internal node and ground to initialize the internal node prior to the store and prior to the restore.

10. The flip-flop circuit of claim 9, wherein the first inverter and second inverter are responsive to respective control signals to be tri-stated as part of the restore of the logic value to the bit node.

11. The flip-flop circuit of claim 9, wherein the first and second MFM devices and the transmission gate are included in a first save-restore circuit coupled to the bit node, and wherein the flip-flop circuit further includes a second save-restore circuit coupled to the bit bar node.

12. A register file circuit comprising:
    a bitcell having a bit node and a bit bar node;
    a first metal-ferroelectric-metal (MFM) device coupled between an internal node and a plate line, the first MFM device to store a logic value of the bit node when a flip-flop circuit is in a sleep state and restore the logic value to the bit node when the flip-flop circuit transitions from the sleep state to an active state;
    a second MFM device coupled between the internal node and ground to provide charge-sharing with the first MFM device for the restore; and
    a transmission gate coupled between the internal node and the bit node to isolate the first and second MFM devices from the bit node when the flip-flop circuit is in the active state; and a selector device coupled between the internal node and ground to initialize the internal node prior to the store and prior to the restore.

13. The register file circuit of claim 12, wherein the plate line is to receive a control signal to control the first MFM device to perform the store and the restore.

14. The register file circuit of claim 12, wherein the first MFM device, the second MFM device, and the transmission gate are included in a first save-restore circuit coupled to the bit node, and wherein the flip-flop circuit further includes a second save-restore circuit coupled to the bit bar node, the second save-restore circuit including a third MFM device and a fourth MFM device.

15. The register file circuit of claim 14, wherein, during a first store operation, one of the first MFM device or the third MFM device is to store the logic value of the respective bit node or bit bar node based on a state of the bit node and bit bar node, and, during a second store operation that occurs before or after the first store operation, the other one of the first MFM device or the third MFM device is to store the logic value of the respective bit node or bit bar node based on the state of the bit node and bit bar node.

16. The register file circuit of claim 12, wherein the restore is performed using a global power rail of the register file circuit that is at an active mode voltage during the active state and at a sleep mode voltage during the sleep state.

17. A computer system comprising:
a battery;
one or more antennas; and
a processor coupled to the battery and the one or more antennas, the processor including:
a logic circuit;
a power management circuit to switch the logic circuit between an active state and a sleep state;
a circuit coupled to the logic circuit to store data for the logic circuit while the logic circuit is in the sleep state and restore the data when the logic circuit transitions from the sleep state to the active state, wherein the circuit includes:
a first inverter and a second inverter cross-coupled between a bit node and a bit bar node;
a first metal-ferroelectric-metal (MFM) device coupled between an internal node and a plate line, the first MFM device to store a logic value of the bit node when the logic circuit is in the sleep state and restore the logic value to the bit node when the logic circuit transitions from the sleep state to the active state;
a second MFM device coupled between the internal node and ground; and
a transmission gate coupled between the internal node and the bit node to isolate the MFM device from the bit node when the logic circuit is in the active state; and
a selector device coupled between the internal node and ground to initialize the internal node prior to the store and prior to the restore.

18. The system of claim 17, wherein the first inverter and second inverter are responsive to respective control signals to be tri-stated as part of the restore of the logic value to the bit node.

19. The system of claim 17, wherein the first MFM device, the second MFM device, and the transmission gate are included in a first save-restore circuit, and wherein the circuit further includes a second save-restore circuit coupled to the bit bar node, the second save-restore circuit including a third MFM device to store a logic value of the bit bar node when the flip-flop circuit is in a sleep state and restore the logic value to the bit bar node when the flip-flop circuit transitions from the sleep state to an active state.

20. The system of claim 19, wherein, during a first store operation, one of the first MFM device or the third MFM device is to store the logic value of the respective bit node or bit bar node based on a state of the bit node and bit bar node, and, during a second store operation that occurs before or after the first store operation, the other one of the first MFM device or the third MFM device is to store the logic value of the respective bit node or bit bar node based on the state of the bit node and bit bar node.

* * * * *